United States Patent
Okumura

(10) Patent No.: US 11,139,377 B2
(45) Date of Patent: Oct. 5, 2021

(54) METHOD OF MANUFACTURING SILICON CARBIDE SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/774,797

(22) Filed: Jan. 28, 2020

(65) Prior Publication Data
US 2020/0295141 A1 Sep. 17, 2020

(30) Foreign Application Priority Data
Mar. 14, 2019 (JP) .............................. JP2019-047713

(51) Int. Cl.
H01L 29/16 (2006.01)
H01L 29/40 (2006.01)
H01L 29/10 (2006.01)
H01L 29/423 (2006.01)

(52) U.S. Cl.
CPC ...... *H01L 29/1608* (2013.01); *H01L 29/1033* (2013.01); *H01L 29/401* (2013.01); *H01L 29/4236* (2013.01)

(58) Field of Classification Search
CPC ............. H01L 29/1608; H01L 29/4236; H01L 29/401; H01L 29/1033; H01L 29/7802; H01L 29/7813
See application file for complete search history.

(56) References Cited

U.S. PATENT DOCUMENTS

| 2013/0105889 | A1* | 5/2013 | Fujiwara | H01L 29/66068 257/330 |
| 2013/0285069 | A1* | 10/2013 | Yano | H01L 29/1608 257/77 |
| 2014/0203300 | A1* | 7/2014 | Hatayama | H01L 21/0475 257/77 |
| 2016/0247910 | A1* | 8/2016 | Suzuki | H01L 29/0623 |
| 2017/0077290 | A1* | 3/2017 | Kono | H01L 29/1608 |
| 2020/0118854 | A1* | 4/2020 | Nishihara | C30B 29/36 |

* cited by examiner

*Primary Examiner* — Changhyun Yi
(74) *Attorney, Agent, or Firm* — Rabin & Berdo, P.C.

(57) ABSTRACT

On a front surface of a silicon carbide semiconductor substrate of a first conductivity type, a first semiconductor layer of the first conductivity type having an impurity concentration lower than an impurity concentration of the silicon carbide semiconductor substrate is formed. A base region of a second conductivity type is selectively formed in the first semiconductor layer. A second semiconductor layer of the second conductivity type is formed on a surface of the first semiconductor layer. A first semiconductor region of the first conductivity type is selectively formed in a surface layer of the second semiconductor layer. The base region is formed by implanting an impurity of the second conductivity type from an angle that relative to a perpendicular to the silicon carbide semiconductor substrate, is three degrees or more.

13 Claims, 17 Drawing Sheets

| CONDITION | p⁺-TYPE BASE REGION | n⁺⁺-TYPE SOURCE REGION | n⁺-TYPE SOURCE REGION |
|---|---|---|---|
| 1 | NO TILT | NO TILT | NO TILT |
| 2 | 7° TILT IN Y DIRECTION | NO TILT | NO TILT |
| 3 | 3° TILT IN X DIRECTION | NO TILT | NO TILT |
| 4 | 7° TILT IN Y DIRECTION | 7° TILT IN Y DIRECTION | 7° TILT IN Y DIRECTION |
| 5 | 3° TILT IN X DIRECTION | 3° TILT IN X DIRECTION | 3° TILT IN X DIRECTION |

METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2019-047713, filed on Mar. 14, 2019, the entire contents of which are incorporated herein by reference.

BACKGROUND OF THE INVENTION

1. Field of the Invention

Embodiments of the invention relate to a method of manufacturing a silicon carbide semiconductor device.

2. Description of the Related Art

Silicon (Si) has been known as a constituent material of power semiconductor devices that control high voltage and large current. Power semiconductor devices are categorized into multiple types such as bipolar transistors, insulated gate bipolar transistors (IGBTs), and metal oxide semiconductor field effect transistors (MOSFETs), and are used selectively according to intended purpose.

For example, bipolar transistors and IGBTs have a higher current density and can be adapted for larger current as compared to MOSFETs; however, bipolar transistors and IGBTs cannot be switched at high speed. For example, bipolar transistors are limited in use around a switching frequency of several kHz, and IGBTs are limited in use around a switching frequency of about several tens of kHz. In contrast, power MOSFETs have a lower current density and are difficult to adapt for larger current as compared to bipolar transistors and IGBTs, but can perform high-speed switching operation up to around several MHz.

However, due to strong market demand for large-current, high speed power semiconductor devices, IGBTs and power MOSFETs have been intensively developed and improved, and the performance of power devices has substantially reached the theoretical limit determined by the material. Semiconductor materials to replace silicon are being studied from the viewpoint of power semiconductor devices, and silicon carbide (SiC) is attracting attention as a semiconductor material enabling fabrication (manufacturing) of a next-generation power semiconductor device having low ON voltage, high-speed characteristics, and high-temperature characteristics.

SiC is a very stable material chemically, has a wide bandgap of 3 eV, and can be used extremely stably as a semiconductor even at high temperatures. Additionally, SiC has a critical electric field strength that is at least ten times greater than the critical field strength of silicon. Since SiC has a high possibility of exceeding the material limits of silicon, future growth is greatly expected in power semiconductor applications, particularly in MOSFETs. In particular, ON resistance is expected to be small. A vertical SiC-MOSFET having lower ON resistance and maintaining high breakdown voltage characteristics can be expected.

A structure of a conventional silicon carbide semiconductor device will be described by taking a vertical MOSFET as an example. FIG. 23 is a cross-sectional view depicting a structure of a conventional silicon carbide semiconductor device. FIG. 23 depicts an example of a trench-type MOSFET 150. As depicted in FIG. 23, an n-type buffer layer 118 is deposited on a front surface of an $n^+$-type silicon carbide substrate 101, and an $n^-$-type silicon carbide epitaxial layer 102 is deposited on a front surface of the n-type buffer layer 118.

An $n^+$-type region 117, a first $p^+$-type base region 103, a second $p^+$-type base region 104, an n-type high-concentration region 105, and a p-type base layer 106 are selectively provided in the $n^-$-type silicon carbide epitaxial layer 102. An $n^{++}$-type source region 107 and a $p^{++}$-type contact region 108 are selectively provided on a surface of the p-type base layer 106.

A trench 116 penetrating the $n^{++}$-type source region 107 and the p-type base layer 106 and reaching the n-type high-concentration region 105 is provided; a gate insulating film 109 is provided on a bottom and side walls of the trench 116 along an inner wall of the trench 116; and a gate electrode 110 is provided on the gate insulating film 109 in the trench 116. A source electrode 112 is provided on a surface of the $p^{++}$-type contact region 108 and the $n^{++}$-type source region 107; and a source electrode pad 115 is provided on the source electrode 112. An interlayer insulating film 111 is provided on an entire surface of a silicon carbide semiconductor substrate base on a first main surface side so as to cover the gate electrode 110 embedded in the trench 116. A barrier metal 114 is provided between the source electrode 112 and the interlayer insulating film 111. A back electrode 113 is provided on a back surface of the $n^+$-type silicon carbide substrate 101.

By providing the first $p^+$-type base region 103 and the second $p^+$-type base region 104, a pn junction may be formed between the first $p^+$-type base region 103/the second $p^+$-type base region 104 and the $n^-$-type silicon carbide epitaxial layer 102/the $n^+$-type region 117 at a position close to the bottom of the trench 116 in a depth direction (direction from the source electrode 112 toward the back electrode 113). By forming such a pn junction, high electric field may be prevented from being applied to the gate insulating film 109 at the bottom of the trench 116. Therefore, even when a wide bandgap semiconductor is used as a semiconductor material, a higher breakdown voltage may be achieved.

The first $p^+$-type base region 103 and the second $p^+$-type base region 104 are formed by growing an n-type epitaxial layer on a front surface of the $n^-$-type silicon carbide epitaxial layer 102 and thereafter, performing ion implantation of a p-type dopant such as aluminum (Al) etc.

SUMMARY OF THE INVENTION

A method of manufacturing a silicon carbide semiconductor device includes forming on a front surface of a silicon carbide semiconductor substrate of a first conductivity type, a first semiconductor layer of the first conductivity type having an impurity concentration lower than an impurity concentration of the silicon carbide semiconductor substrate; selectively forming a base region of a second conductivity type in the first semiconductor layer; forming a second semiconductor layer of the second conductivity type on a surface of a first side of the first semiconductor layer opposite to a second side of the first semiconductor layer facing the silicon carbide semiconductor substrate; selectively forming a first semiconductor region of the first conductivity type in a surface layer of the second semiconductor layer; forming a plurality of trenches penetrating through the first semiconductor region and the second semiconductor layer, and reaching the first semiconductor layer; forming a plurality of gate electrodes, each of which is formed in a corresponding one of the trenches via a gate insulating film; forming an interlayer insulating film on the gate electrodes; forming a first electrode in contact with the second semiconductor layer and the first semiconductor region; and forming a second electrode on a rear surface of the silicon carbide semiconductor substrate opposite to the front surface. Forming the base region includes implanting an impurity of the second conductivity type from an angle that relative to a perpendicular to the front surface of the silicon carbide semiconductor substrate, is three degrees or more, to form the base region.

In the embodiment, forming the base region includes forming the base region by implanting the impurity of the second conductivity type from the angle that relative to the perpendicular to the front surface of the silicon carbide semiconductor substrate, is three degrees or more in a direction of an off angle of the silicon carbide semiconductor substrate.

In the embodiment, forming the base region includes forming the base region by implanting the impurity of the second conductivity type from the angle that relative to the perpendicular to the front surface of the silicon carbide semiconductor substrate, is seven degrees or more in a direction different from a direction of an off angle of the silicon carbide semiconductor substrate.

In the embodiment, forming the base region includes forming the base region in a stripe-shape by implanting the impurity of the second conductivity type from the angle that relative to the perpendicular to the front surface of the silicon carbide semiconductor substrate, is three degrees or more in a longitudinal direction of the base region.

In the embodiment, forming the plurality of trenches includes forming each of the plurality of trenches to extend in a longitudinal direction thereof, to form a shape of a stripe, and forming the base region includes forming the base region by implanting the impurity of the second conductivity type from the angle that relative to the perpendicular to the front surface of the silicon carbide semiconductor substrate, is three degrees or more in the longitudinal direction of the plurality of trenches.

In the embodiment, the second semiconductor layer includes an a-plane and an m-plane. Forming the plurality of trenches includes forming each of the plurality of trenches to have a sidewall on the m-plane of the second semiconductor layer. Forming the base region includes forming the base region by implanting the impurity of the second conductivity type from the angle that relative to the perpendicular to the front surface of the silicon carbide semiconductor substrate, is three degrees or more in a direction of an off angle of the silicon carbide semiconductor substrate.

In the embodiment, the second semiconductor layer includes an a-plane and an m-plane. Forming the plurality of trenches includes forming each of the plurality of trenches to have a sidewall on the a-plane of the second semiconductor layer. Forming the base region includes forming the base region by implanting the impurity of the second conductivity type from the angle that relative to the perpendicular to the front surface of the silicon carbide semiconductor substrate, is seven degrees or more in a direction different from an off angle of the silicon carbide semiconductor substrate.

In the embodiment, forming the plurality of trenches includes forming the plurality of trenches to have a polygonal cell shape, and forming the base region includes forming the base region by implanting the impurity of the second conductivity type from the angle that relative to the perpendicular to the front surface of the silicon carbide semiconductor substrate, is seven degrees or more in a direction different from an off angle of the silicon carbide semiconductor substrate.

In the embodiment, the base region is formed by a first base region formed between two adjacent trenches of the plurality of trenches, and a second base region formed at a bottom of a corresponding one of the plurality of trenches.

In the embodiment, the method further includes selectively forming a second semiconductor region of the second conductivity type in contact with the first semiconductor region in the surface layer of the second semiconductor layer by implanting an impurity of the second conductivity type from an angle that relative to the perpendicular to the silicon carbide semiconductor substrate, is three degrees or more. Forming the second semiconductor layer includes implanting an impurity of the second conductivity type into the second semiconductor layer from an angle that relative to the perpendicular of the silicon carbide semiconductor substrate, is three degrees or more. Forming the first semiconductor region includes forming the first semiconductor region by implanting an impurity of the first conductivity type from an angle that relative to the perpendicular to the silicon carbide semiconductor substrate, is three degrees or more.

In the embodiment, an oxide film mask is used in implanting an impurity of the first conductivity type and an impurity of the second conductivity type.

In the embodiment, the impurity of the second conductivity type is aluminum.

Objects, features, and advantages of the present invention are specifically set forth in or will become apparent from the following detailed description of the invention when read in conjunction with the accompanying drawings.

DETAILED DESCRIPTION OF THE INVENTION

Figure 24:
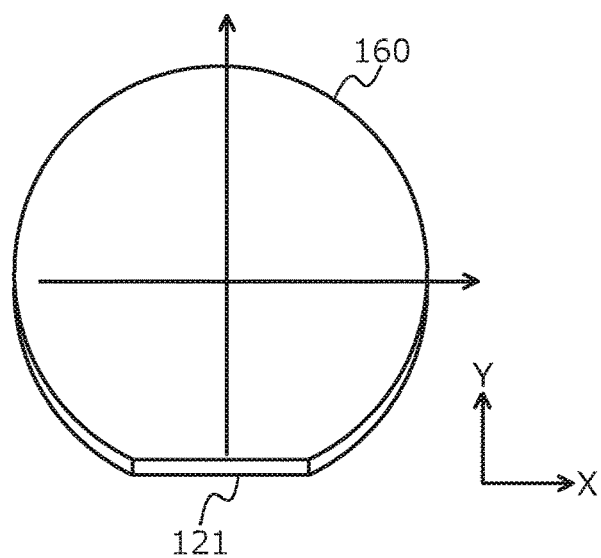
FIG. 24 is a top view depicting a silicon carbide semiconductor wafer.
Figure 25:
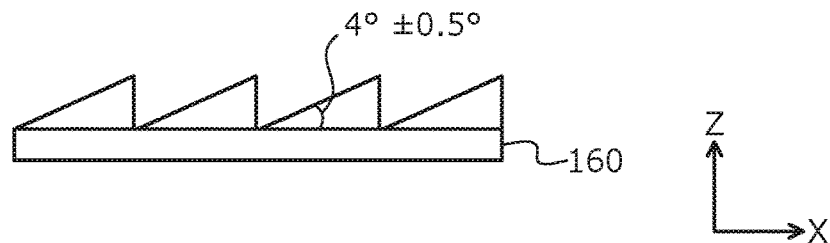
FIG. 25 is a cross-sectional view of the silicon carbide semiconductor wafer along the X-axis direction.

First, problems associated with the conventional techniques will be described. FIG. 24 is a top view depicting a silicon carbide semiconductor wafer. The trench type MOSFET 150 described above is formed on the silicon carbide semiconductor wafer. In this description, an X-axis direction and a Y-axis direction are defined as directions parallel and orthogonal, respectively, to an orientation flat 121. A silicon carbide semiconductor wafer 160 is provided with an off angle of 4 degrees so as to epitaxially grow a semiconductor layer on the silicon carbide semiconductor wafer 160. According to an off-angle standard, the off angle has an error of ±0.5 degrees. FIG. 25 is a cross-sectional view of the silicon carbide semiconductor wafer along the X-axis direction. As depicted in FIG. 25, the off angle is provided in the X-axis direction.

Since the silicon carbide semiconductor wafer 160 is provided with the off angle, assuming that channeling does not occur, when the first $p^+$-type base region 103 and the second $p^+$-type base region 104 (hereinafter referred to as $p^+$-type base regions) are formed by ion implantation, the ion implantation is conventionally performed at an angle of 0 degrees from the center of the silicon carbide semiconductor wafer 160 without providing a tilt (incline) to the ion beam. The silicon carbide semiconductor wafer 160 having a crystal structure has a portion where atoms are densely arranged and a portion where atoms are sparse, depending on crystal orientation. Channeling means that when ions are implanted in a direction in which atoms are sparse, a probability of collision of implanted ions with crystal atoms is reduced, which increases a probability of deep implantation into crystals.

Figure 26:
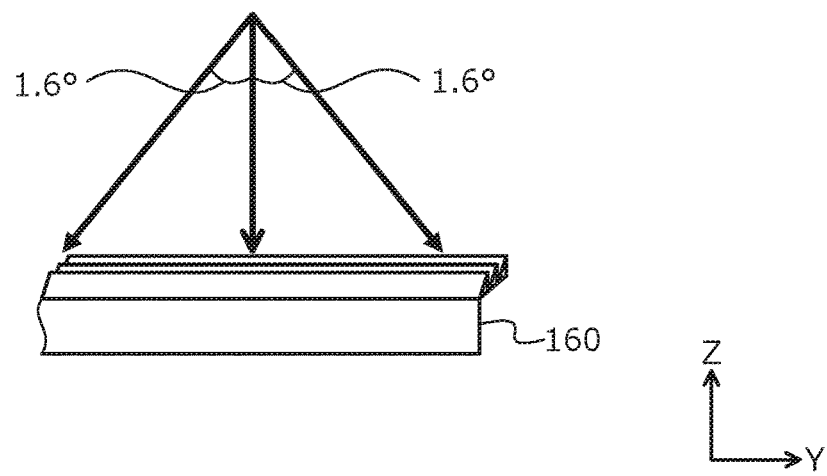
FIG. 26 is a cross-sectional view depicting ion implantation in a conventional method of manufacturing a silicon carbide semiconductor device, from the Y-axis direction.
Figure 27:
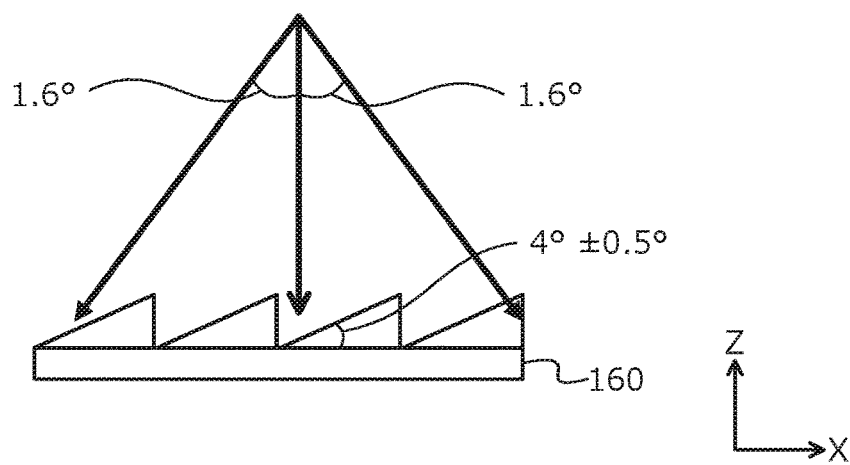
FIG. 27 is a cross-sectional view depicting ion implantation in the conventional method of manufacturing the silicon carbide semiconductor device, from the X-axis direction.

However, in the case of ion implantation performed at an angle of 0 degrees from the center of the silicon carbide semiconductor wafer 160, when the ion implantation is performed for the silicon carbide semiconductor wafer 160 having a diameter of 6 inches, by a single-scan ion implantation apparatus having a single scanning direction (e.g., an ion implantation apparatus manufactured by ULVAC: model number IH-860DSIC), an incline up to 1.6 degrees occurs. FIG. 26 is a cross-sectional view depicting ion implantation in the conventional method of manufacturing the silicon carbide semiconductor device, from the Y-axis direction. As depicted in the drawing, when the scan direction is the Y-axis direction, an incline up to 1.6 degrees occurs in the Y-axis direction. FIG. 27 is a cross-sectional view depicting ion implantation in the conventional method of manufacturing the silicon carbide semiconductor device, from the X-axis direction. As depicted in the drawing, when the scan direction is the X-axis direction, an incline up to 1.6 degrees occurs in the X-axis direction. With consideration of the off-angle standard (±0.5 degrees), an incline of 2.4 degrees (4-1.6), or 1.9 degrees (4-0.5-1.6) at minimum, occurs between an ion beam and a front surface of the silicon carbide semiconductor wafer 160.

Figure 28:
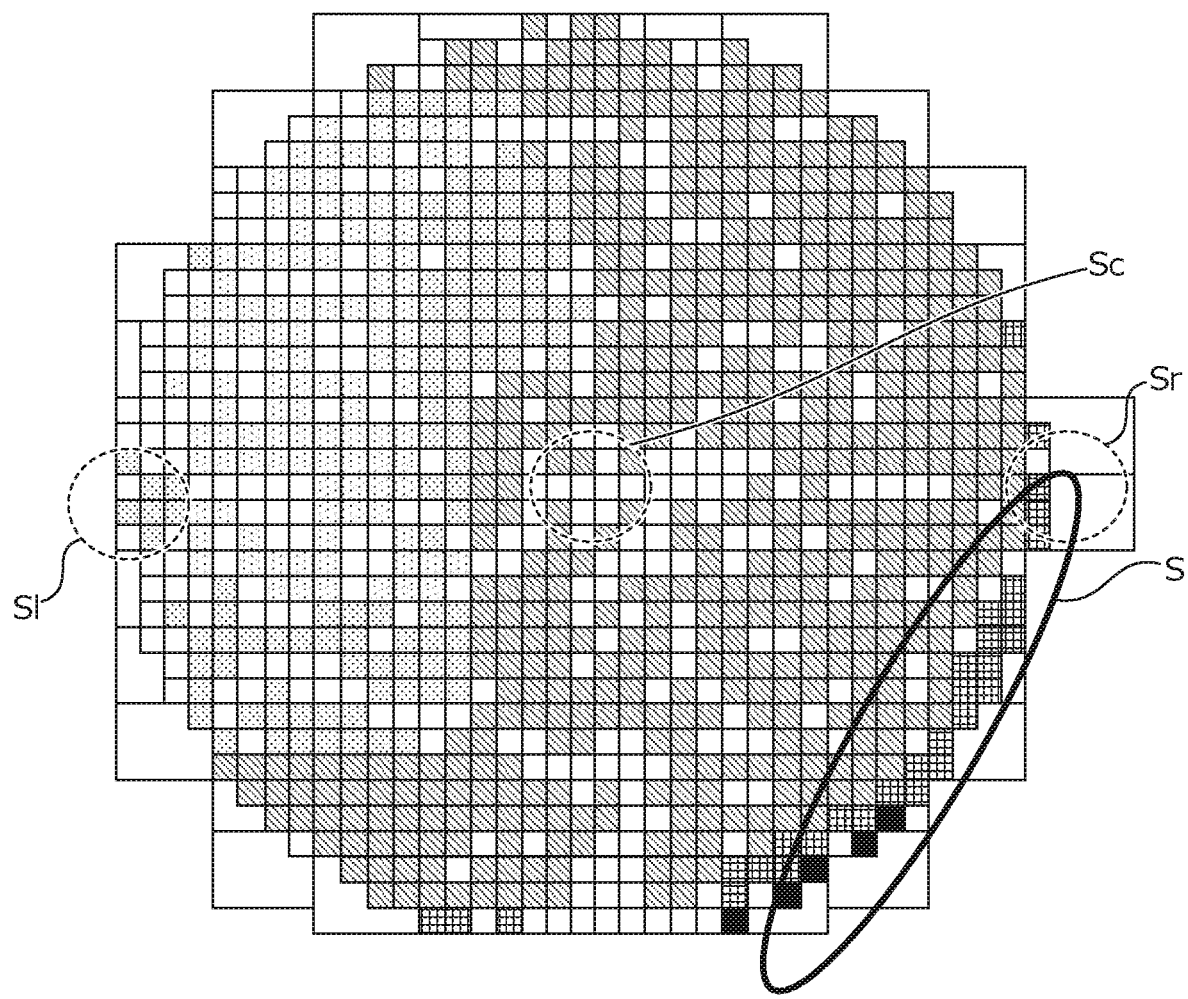
FIG. 28 is a top view depicting Von of silicon carbide semiconductor devices formed on a silicon carbide semiconductor wafer.

FIG. 28 is a top view depicting Von of silicon carbide semiconductor devices formed on a silicon carbide semiconductor wafer. In FIG. 28, the ON voltage (Von) of the silicon carbide semiconductor devices is classified into 11 levels from 1.0 V to 2.0V to depict a distribution of Von on the silicon carbide semiconductor wafer. According to FIG. 28, silicon carbide semiconductor devices having high Von are concentrated in a lower right region S of the silicon carbide semiconductor wafer.

Figure 29:
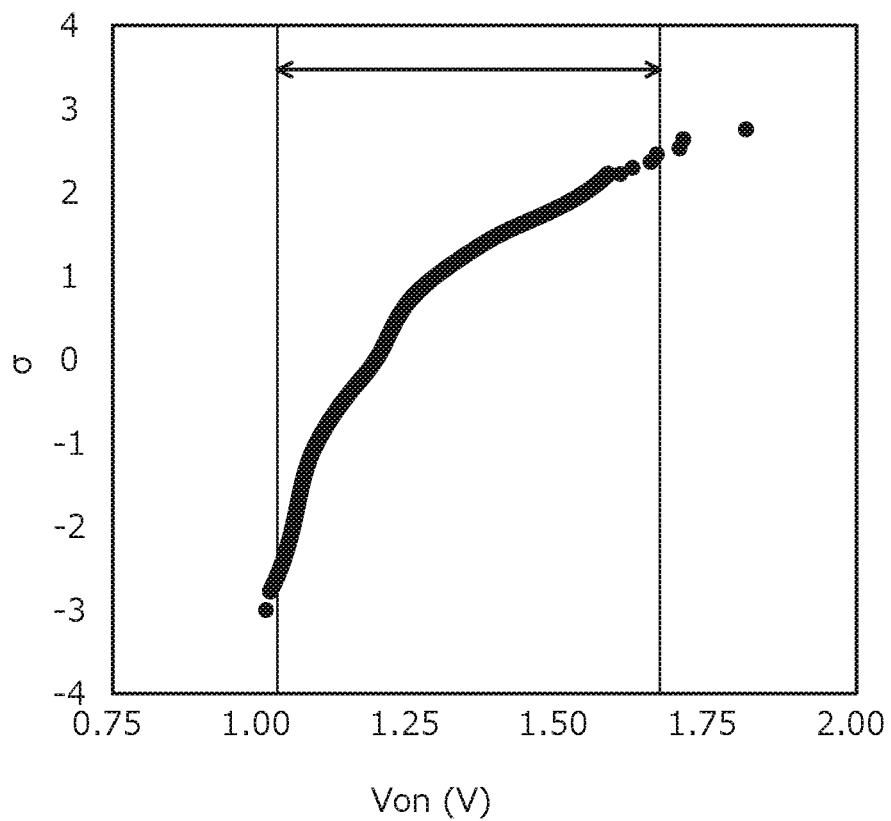
FIG. 29 is a graph depicting a normal probability distribution plot of Von of the silicon carbide semiconductor devices formed on the silicon carbide semiconductor wafer.

FIG. 29 is a graph depicting a normal probability distribution plot of Von of the silicon carbide semiconductor devices formed on the silicon carbide semiconductor wafer. In FIG. 29, the horizontal axis indicates Von in V, and the vertical axis indicates standard deviation a. When the distribution of Von of the silicon carbide semiconductor devices is a normal distribution, the distribution is plotted on a straight line; however, in FIG. 29, a portion of high Von deviates from a straight line. This is because a large number of silicon carbide semiconductor devices have high Von so that the standard deviation a becomes lower in the portion with high Von. Since a silicon carbide semiconductor device with high Von is a defective product, a process capability index katayori Cpk indicative of a capability of preventing a defective product is as low as 0.54.

Figure 30:
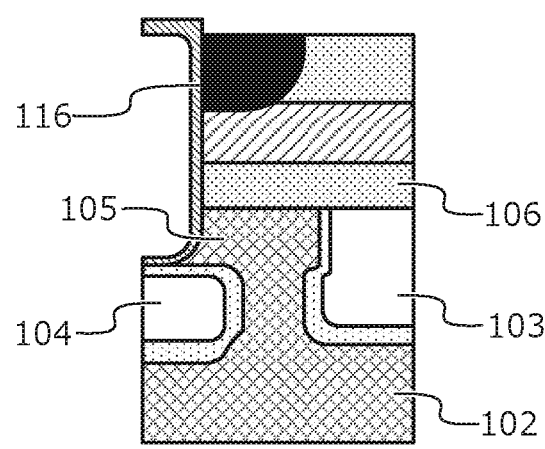
FIG. 30 is a cross-sectional view depicting a structure of the conventional silicon carbide semiconductor device formed on a left side of the silicon carbide semiconductor wafer.
Figure 31:
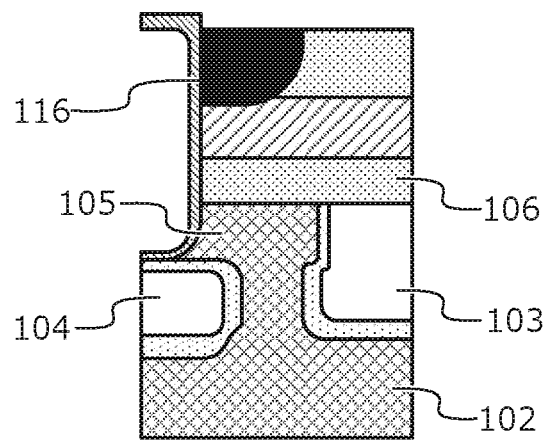
FIG. 31 is a cross-sectional view depicting a structure of the conventional silicon carbide semiconductor formed in a central portion of the silicon carbide semiconductor wafer.
Figure 32:
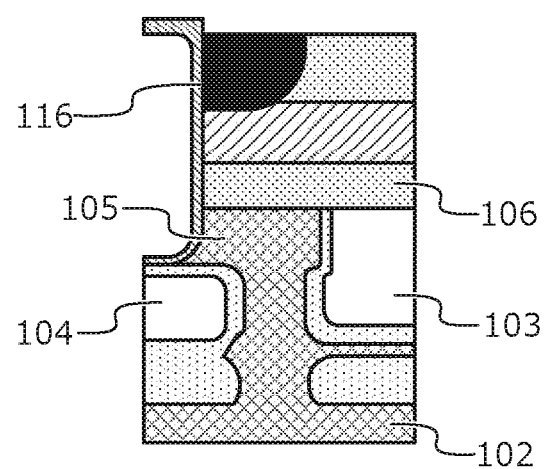
FIG. 32 is a cross-sectional view depicting a structure of the conventional silicon carbide semiconductor device formed on a right side of the silicon carbide semiconductor wafer.

FIG. 30 is a cross-sectional view depicting a structure of the conventional silicon carbide semiconductor device formed on a left side of the silicon carbide semiconductor wafer. For example, the structure of the silicon carbide semiconductor device formed in a region SI of FIG. 28 is depicted. FIG. 31 is a cross-sectional view depicting a structure of the conventional silicon carbide semiconductor formed in a central portion of the silicon carbide semiconductor wafer. For example, the structure of the silicon carbide semiconductor device formed in a region Sc of FIG. 28 is depicted. FIG. 32 is a cross-sectional view depicting a structure of the conventional silicon carbide semiconductor device formed on a right side of the silicon carbide semiconductor wafer. For example, the structure of the silicon carbide semiconductor device formed in a region Sr of FIG. 28 is depicted.

In comparing the structures of FIGS. 30 to 32, a junction field effect transistor (JFET) width, for example, a width of the n-type high-concentration region 105 interposed between the first $p^+$-type base region 103 and the second $p^+$-type base region 104 is about a same size in each of FIGS. 30 to 32. However, in the structure of FIG. 32, it can be seen that the first $p^+$-type base region 103 and the second $p^+$-type base region 104 deeply penetrate the $n^-$-type silicon carbide epitaxial layer 102. As a result, an increase of a narrow portion of the n-type high-concentration region 105 increases a JFET resistance, whereby Von is increased.

This is because an incline of 2.4 degrees, or 1.9 degrees at minimum, occurring on the right side of the silicon carbide semiconductor wafer causes channeling, whereby ions implanted by ion implantation are implanted deeply into the $n^-$-type silicon carbide epitaxial layer 102.

Although the case of a silicon carbide semiconductor wafer having a diameter of 6 inches has been described, an incline up to 2.1 degrees occurs in a silicon carbide semiconductor wafer having a diameter of 8 inches. As a result, an incline of 1.9 degrees (4-2.1), or 1.4 degrees (4-0.5-2.1) at minimum, occurs between the ion beam and the front surface of the silicon carbide semiconductor wafer 160. This causes the channeling as in the case of a 6-inch diameter.

Embodiments of a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

A structure of a silicon carbide semiconductor device manufactured by a method of manufacturing a silicon carbide semiconductor device according to an embodiment is the same as the structure of the conventional silicon carbide semiconductor device and therefore, will not be described. The method of manufacturing a silicon carbide semiconductor device according to the embodiment will now be described. FIGS. 1, 2, 3, 4, 5, and 6 are cross-sectional views schematically depicting states of the silicon carbide semiconductor device according to the embodiment during manufacture.

First, an $n^+$-type silicon carbide substrate (silicon carbide semiconductor substrate of a first conductivity type) 1 containing an n-type silicon carbide is prepared. The $n^+$-type silicon carbide substrate 1 is manufactured such that a surface has a predetermined angle relative to a certain crystal plane. This predetermined angle is called an off angle. On a first main surface of the $n^+$-type silicon carbide substrate 1, an n-type low-concentration buffer layer 18a having an impurity concentration lower than the $n^+$-type silicon carbide substrate 1 containing silicon carbide is epitaxially grown while an n-type impurity, for example, nitrogen atoms (N), is doped. An n-type high-concentration buffer layer 18b having an impurity concentration higher than that of the $n^+$-type silicon carbide substrate 1 containing silicon carbide is then epitaxially grown while an n-type impurity, for example, nitrogen atoms (N), is doped. The n-type low-concentration buffer layer 18a and the n-type high-concentration buffer layer 18b together form an n-type buffer layer 18.

Figure 1:
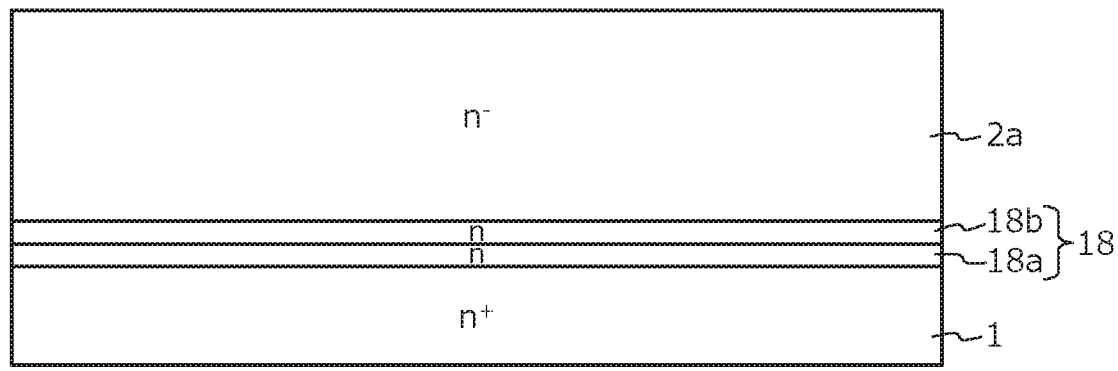
FIG. 1 is a cross-sectional view schematically depicting a state of a silicon carbide semiconductor device according to an embodiment during manufacture.

Subsequently, on a surface of the n-type high-concentration buffer layer 18b, a first $n^-$-type silicon carbide epitaxial layer 2a containing silicon carbide is epitaxially growth to a thickness of about 30 μm, for example, while an n-type impurity, for example, nitrogen atoms (N), is doped. The state up to here is depicted in FIG. 1.

Subsequently, a mask (not depicted) having predetermined openings is formed on a surface of the first $n^-$-type silicon carbide epitaxial layer 2a by a photolithography technique using, for example, an oxide film. The oxide film may be used as a mask to perform ion implantation of an n-type impurity, for example, nitrogen atoms, by an ion implantation method. As a result, in each of the openings, an $n^+$-type region 17 is formed in the first $n^-$-type silicon carbide epitaxial layer 2a.

Subsequently, the mask used during the ion implantation for forming the $n^+$-type region 17 is removed. An ion implantation mask having predetermined openings is then formed on the surface of the first $n^-$-type silicon carbide epitaxial layer by a photolithography technique using, for example, an oxide film. A p-type impurity such as aluminum is implanted into the openings of the oxide film, thereby forming in each of the openings, a lower first $p^+$-type base region 3a having a depth of about 0.5 μm. In a case where the $n^+$-type regions 17 are formed, the lower first $p^+$-type base regions 3a are formed on surfaces of the $n^+$-type regions 17, respectively, on first sides of the $n^+$-type regions 17 opposite to second sides thereof facing toward the $n^+$-type silicon carbide substrate 1, the lower first $p^+$-type base regions 3a are formed overlapping with the $n^+$-type regions 17. Second $p^+$-type base regions (base regions of a second conductivity type, second base regions) 4 each serving as a bottom of a trench 16 may be formed concurrently with the lower first p$^+$-type base regions 3a. A lower first p$^+$-type base region 3a and a second p$^+$-type base region 4 adjacent to each other are formed to have a distance of about 1.5 μm therebetween. Impurity concentrations of the lower first p$^+$-type base regions 3a and of the second p$^+$-type base regions 4 are set to about 5×10$^{18}$/cm$^3$, for example.

Figure 2:
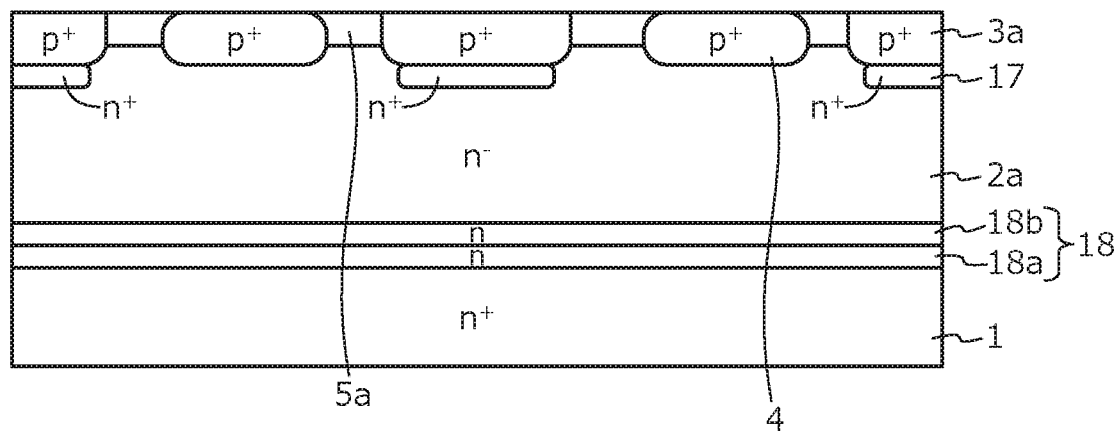
FIG. 2 is a cross-sectional view schematically depicting a state of the silicon carbide semiconductor device according to the embodiment during manufacture.

Subsequently, the ion implantation mask may be removed partially and an n-type impurity such as nitrogen may be ion-implanted into the openings to form in portions of a surface region of the first n$^-$-type silicon carbide epitaxial layer 2a, a lower n-type high-concentration region 5a having, for example, a depth of about 0.5 μm. An impurity concentration of the lower n-type high-concentration region 5a is set to be about 1×10$^{17}$/cm$^3$, for example. The state up to here is depicted in FIG. 2.

Subsequently, a second n$^-$-type silicon carbide epitaxial layer 2b doped with an n-type impurity such as nitrogen is formed on the surface of the first n$^-$-type silicon carbide epitaxial layer 2a to a thickness of about 0.5 μm. An impurity concentration of the second n$^-$-type silicon carbide epitaxial layer 2b is set to be about 3×10$^{15}$/cm$^3$, for example. Subsequently, the first n$^-$-type silicon carbide epitaxial layer 2a and the second n$^-$-type silicon carbide epitaxial layer 2b together form an n$^-$-type silicon carbide epitaxial layer (first semiconductor layer of the first conductivity type) 2.

Subsequently, an ion implantation mask having predetermined openings is formed on a surface of the second n$^-$-type silicon carbide epitaxial layer 2b by photolithography using, for example, an oxide film. A p-type impurity such as aluminum is implanted into the openings of the oxide film, thereby forming in each of the openings, an upper first p$^+$-type base region 3b having a depth of about 0.5 μm and overlapping with the lower first p$^+$-type base region 3a. The lower first p$^+$-type base region 3a and the overlapping upper first p$^+$-type base region 3b form a continuous region and serve as a first p$^+$-type base region (base region of the second conductivity type, first base region) 3. An impurity concentration of the upper first p$^+$-type base regions 3b is set to be about 5×10$^{18}$/cm$^3$, for example.

Figure 3:
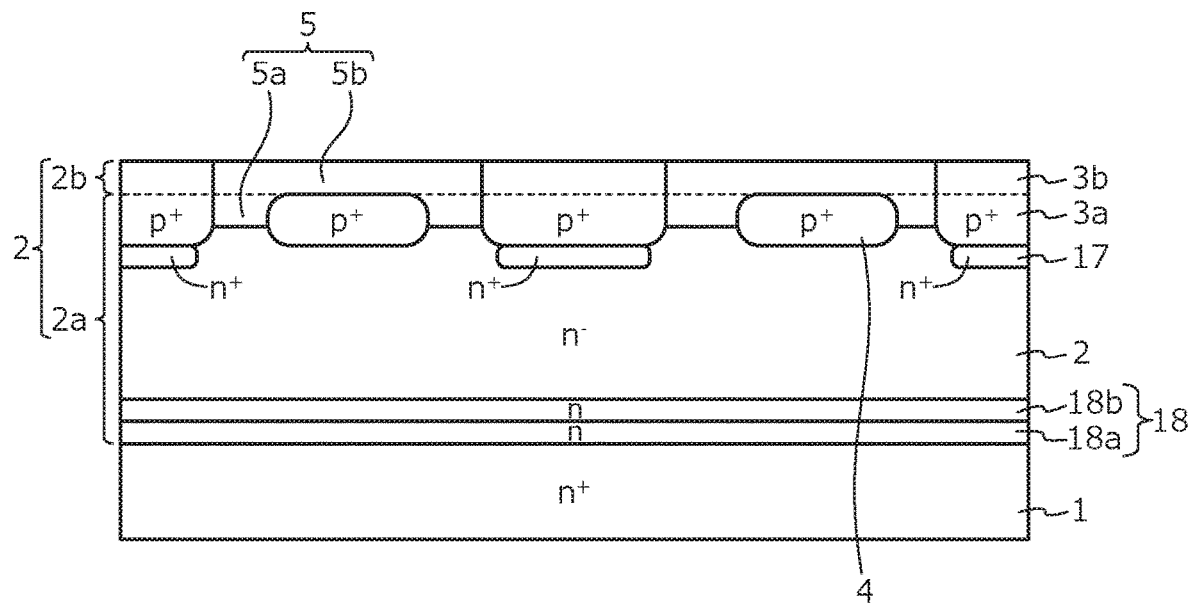
FIG. 3 is a cross-sectional view schematically depicting a state of the silicon carbide semiconductor device according to the embodiment during manufacture.

Subsequently, the ion implantation mask may be removed partially and an n-type impurity such as nitrogen may be ion-implanted into the openings to form in portions of a surface region of the second silicon carbide epitaxial layer 2b, an upper n-type high-concentration region 5b having, for example, a depth of about 0.5 μm. An impurity concentration of the upper n-type high-concentration regions 5b is set to be about 1×10$^{17}$/cm$^3$, for example. The upper n-type high-concentration region 5b and the lower n-type high-concentration region 5a are formed at least partially in contact with each other and form an n-type high-concentration region 5. It is noted that the n-type high-concentration region 5 may or may not be formed on the surface of the substrate overall. The state up to here is depicted in FIG. 3.

Subsequently, a p-type base layer (second semiconductor layer of the second conductivity type) 6 is formed to a thickness of about 1.3 μm by epitaxial growth on a surface of the n$^-$-type silicon carbide epitaxial layer 2. The impurity concentration of the p-type base layer 6 is set to be about 4×10$^{17}$/cm$^3$. After the p-type base layer 6 is formed by epitaxial growth, a p-type impurity such as aluminum may further be ion-implanted into the p-type base layer 6. Alternatively, the p-type base layer 6 may be formed by ion implantation of a p-type impurity such as aluminum into the surface of the n$^-$-type silicon carbide epitaxial layer 2.

Figure 4:
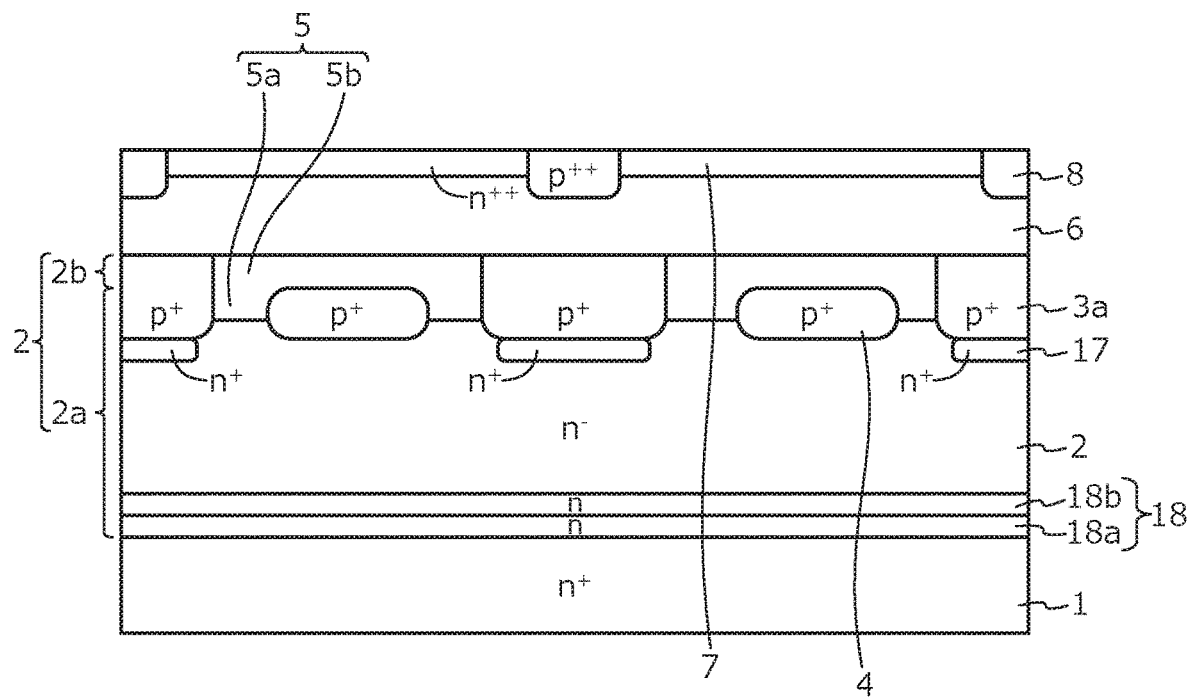
FIG. 4 is a cross-sectional view schematically depicting a state of the silicon carbide semiconductor device according to the embodiment during manufacture.

Subsequently, an ion implantation mask having a predetermined opening is formed of, for example, an oxide film by photolithography on a surface of the p-type base layer 6. By performing ion implantation of an n-type impurity such as phosphorus (P) into the opening, an n$^{++}$-type source region (first semiconductor region of the first conductivity type) 7 is formed in a portion of the surface of the p-type base layer 6. The impurity concentration of the n$^{++}$-type source region 7 is set higher than the impurity concentration of the p-type base layer 3. The ion implantation mask used for forming the n$^{++}$-type source region 7 may then be removed, an ion implantation mask having predetermined openings may be formed by the same method, and a p-type impurity such as aluminum may be ion-implanted into a portion of the surface of the p-type base layer 6, thereby forming a p$^{++}$-type contact region (second semiconductor region) 8. An impurity concentration of the p$^{++}$-type contact region 8 is set higher than the impurity concentration of the p-type base layer 3. The state up to here is depicted in FIG. 4.

Subsequently, a heat treatment (annealing) is performed in an inert gas atmosphere of about 1700° C., thereby implementing an activation treatment to the first p$^+$-type base region 3, the second p$^+$-type base region 4, the n$^{++}$-type source region 7, the p$^{++}$-type contact region 8, and the n$^+$-type region 17. The ion implanted regions may be activated collectively by one session of the heat treatment as described above or the heat treatment may be performed each time ion implantation is performed.

Figure 5:
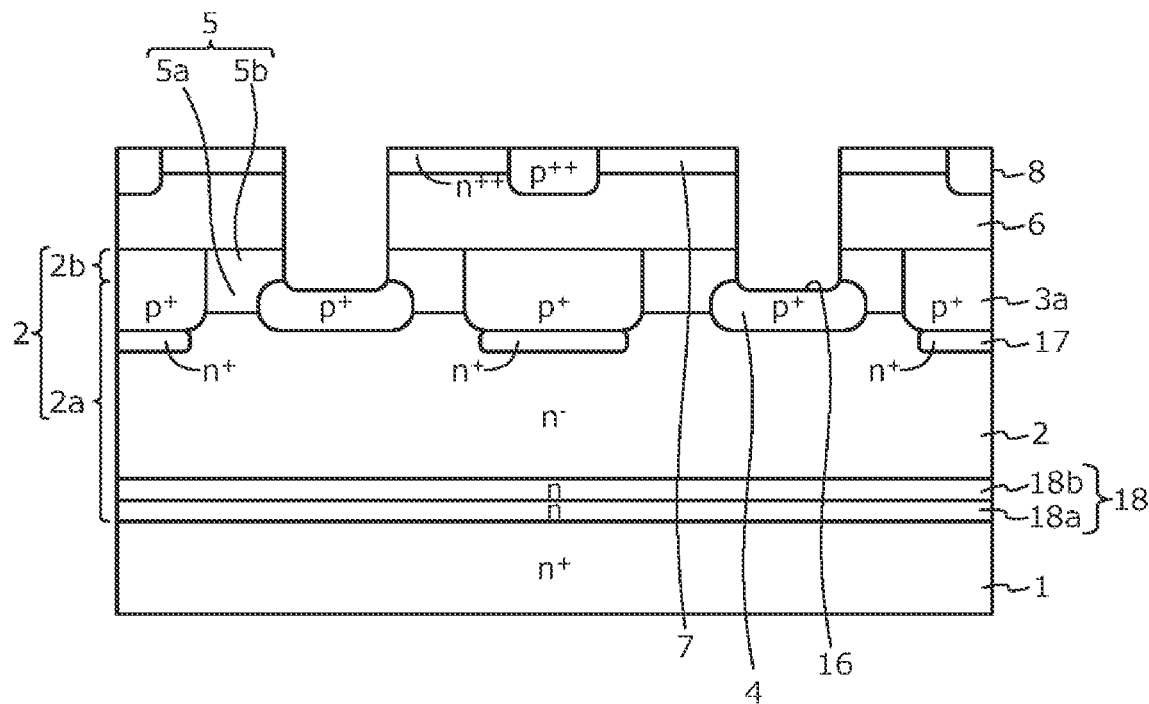
FIG. 5 is a cross-sectional view schematically depicting a state of the silicon carbide semiconductor device according to the embodiment during manufacture.

Subsequently, a trench formation mask having predetermined openings is formed on the surface of the p-type base layer 6 by photolithography using, for example, an oxide film. The p-type base layer 6 is then penetrated by dry etching to form the trench 16 reaching the n-type high-concentration region 5 (in a case where the n-type high-concentration region 5 is not formed, the n$^-$-type silicon carbide epitaxial layer 2, hereinafter abbreviated as (2)). A bottom of the trench 16 may reach the second p$^+$-type base region 4 formed in the n-type high-concentration region 6 (2). The trench formation mask is then removed. The state up to here is depicted in FIG. 5.

A gate insulating film 9 is formed along a surface of the n$^{++}$-type source region 7 and the bottom and side walls of each trench 16. The gate insulating film 9 may be formed by thermal oxidation at a temperature of about 1000° C. in an oxygen atmosphere. This gate insulating film 9 may be formed by a method in which deposition is caused by a chemical reaction such as high temperature oxidation (HTO).

Subsequently, a polycrystalline silicon layer doped with, for example, phosphorus atoms is provided on the gate insulating film 9. This polycrystalline silicon layer may be formed embedded in the trenches 16. The polycrystalline silicon layer is patterned by photolithography and left inside the trenches 16 to form gate electrodes 10.

Figure 6:
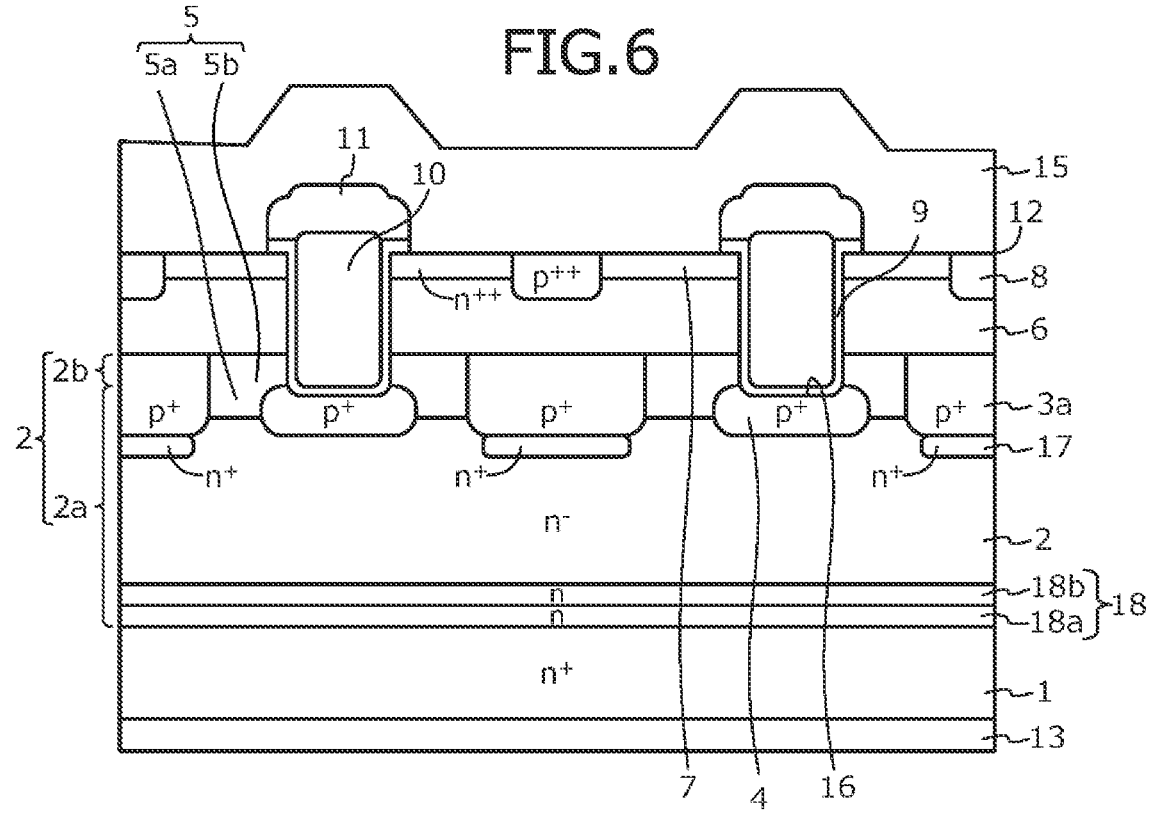
FIG. 6 is a cross-sectional view schematically depicting a state of the silicon carbide semiconductor device according to the embodiment during manufacture.

Subsequently, for example, a phosphate glass is deposited to a thickness of about 1 μm so as to cover the gate insulating film 9 and the gate electrode 10, and form an interlayer insulating film 11. A barrier metal (not depicted) containing titanium (Ti) or titanium nitride (TiN) may be formed so as to cover the interlayer insulating film 11. The interlayer insulating film 11 and the gate insulating film 9 are patterned by photolithography to form contact holes exposing the n$^{++}$-type source region 7 and the p$^{++}$-type contact regions 8. A heat treatment (reflow) is subsequently performed to planarize the interlayer insulating film 11. The state up to here is depicted in FIG. 6.

The interlayer insulating film 11 is selectively removed and a film of nickel (Ni) or Ti is deposited on a surface of the silicon carbide semiconductor substrate base. The surface is then protected, and a film of Ni or Ti is formed on the back side of the $n^+$-type silicon carbide substrate 1. A heat treatment is then performed at about 1000° C. and ohmic electrode properties are formed on the surface side of the silicon carbide semiconductor substrate base and a surface side of the back surface of the $n^+$-type silicon carbide substrate 1.

Subsequently, a conductive film serving as a source electrode 12 is provided on the interlayer insulating film 11 in contact with the ohmic electrode portion formed in the contact hole. This conductive film is selectively removed to leave the source electrode only in the contact hole, whereby the $n^{++}$-type source region 7 and the $p^{++}$-type contact region 8 are in contact with the source electrode. The source electrode other than that of the contact hole is then selectively removed.

Subsequently, a back electrode 13, for example, is formed by a nickel (Ni) film on a second main surface of the $n^+$-type silicon carbide substrate 1. A heat treatment is then performed at a temperature of about 970° C., for example, thereby forming an ohmic junction between the $n^+$-type silicon carbide substrate 1 and the back electrode 13.

Subsequently, an electrode pad serving as a source electrode pad (not depicted) is deposited on the source electrode on the front surface of the silicon carbide semiconductor substrate base and in an opening of the interlayer insulating film 11 by a sputtering method, for example. A thickness of a portion of the electrode pad on the interlayer insulating film 11 may be 5 μm, for example. The electrode pad may be made of, for example, aluminum (Al—Si) containing silicon at a proportion of 1%. The source electrode pad is then selectively removed.

Subsequently, for example, films of titanium (Ti), nickel (Ni), and gold (Au) are formed in this order as a drain electrode pad (not depicted) on a surface of the back electrode 13.

In the method of manufacturing a silicon carbide semiconductor device according to the embodiment, when the lower first $p^+$-type base region 3$a$, the upper first $p^+$-type base region 3$b$, and the second $p^+$-type base region 4 are formed by ion implantation, an ion beam of the ion implantation is inclined (tilted) by 3 degrees or more relative to a perpendicular from the center of the silicon carbide semiconductor wafer. Therefore, ions are implanted with a certain incline with respect to the front surface of the silicon carbide semiconductor wafer in the embodiment, so that channeling may be prevented. This incline may be provided in a direction that is either an off-angle direction or a direction different from the off angle.

The silicon carbide semiconductor wafer is provided with an orientation flat, for example, in a <11-20> direction so as to indicate the crystal orientation of the silicon carbide semiconductor substrate. For example, the orientation flat is formed by polishing an edge of the silicon carbide semiconductor substrate so that a portion of the perimeter has a linear shape (see FIG. 24). When the X axis and the Y axis are defined in directions parallel and perpendicular, respectively, to the orientation flat, the off angle is provided in the X-axis direction (see FIG. 27). In this case, the direction of the off angle is the positive direction of the X axis, and a direction different from the off angle is the Y-axis direction. The perpendicular is a straight line in a Z-axis direction orthogonal to the X-axis direction and the Y-axis direction.

Figure 7:
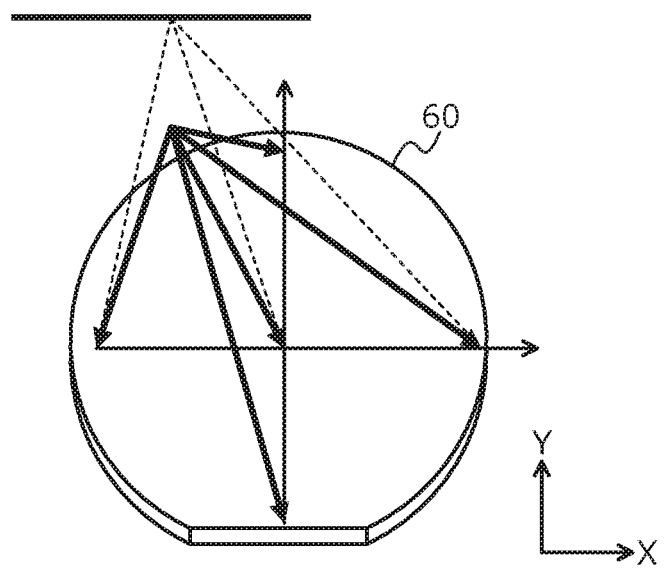
FIG. 7 is a top view depicting ion implantation with an incline in a direction different from an off angle in the method of manufacturing a silicon carbide semiconductor device according to the embodiment.
Figure 8:
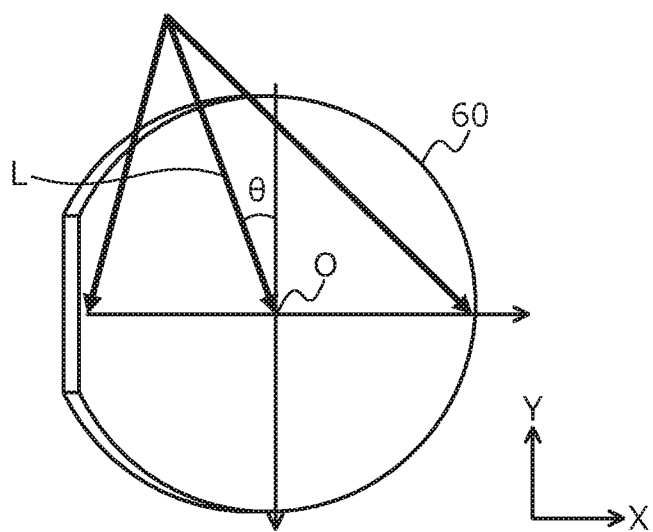
FIG. 8 is a top view of another direction depicting ion implantation with an incline in the off-angle direction in the method of manufacturing a silicon carbide semiconductor device according to the embodiment.
Figure 9:
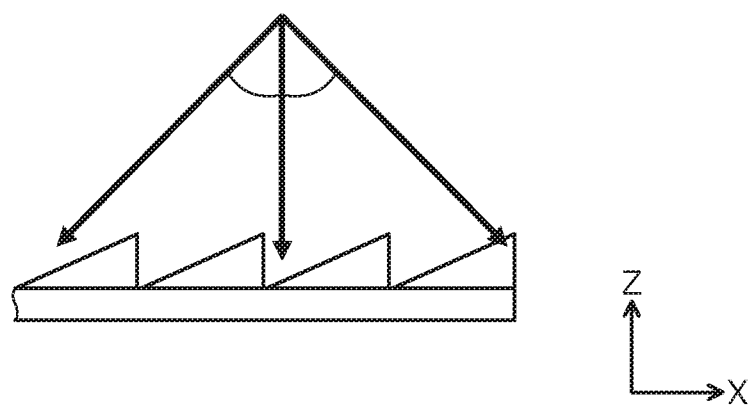
FIG. 9 is a cross-sectional view of the ion implantation of FIGS. 7 and 8 in the method of manufacturing a silicon carbide semiconductor device according to the embodiment as viewed from a Y-axis direction.
Figure 10:
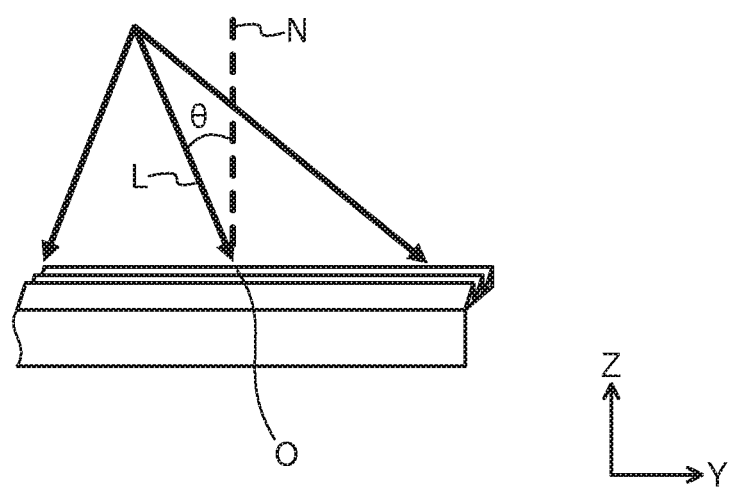
FIG. 10 is a cross-sectional view of the ion implantation of FIGS. 7 and 8 in the method of manufacturing a silicon carbide semiconductor device according to the embodiment as viewed from an X-axis direction.

First, a form of an incline provided in the direction different from the off angle will be described. FIG. 7 is a top view depicting ion implantation with an incline in the direction different from the off angle in the method of manufacturing a silicon carbide semiconductor device according to the embodiment. FIG. 8 is a top view of another direction depicting ion implantation with an incline in the off-angle direction in the method of manufacturing a silicon carbide semiconductor device according to the embodiment. FIG. 9 is a cross-sectional view of the ion implantation of FIGS. 7 and 8 in the method of manufacturing a silicon carbide semiconductor device according to the embodiment as viewed from the Y-axis direction. FIG. 10 is a cross-sectional view of the ion implantation of FIGS. 7 and 8 in the method of manufacturing a silicon carbide semiconductor device according to the embodiment as viewed from the X-axis direction.

In the example depicted in FIGS. 8 and 10, a tilt angle θ is provided, in the Y-axis direction, between an ion beam L that reaches a center O of a silicon carbide semiconductor wafer 60 and a perpendicular N from the center O of the silicon carbide semiconductor wafer 60. As described later, the tilt angle θ may be 7 degrees or more.

Figure 11:
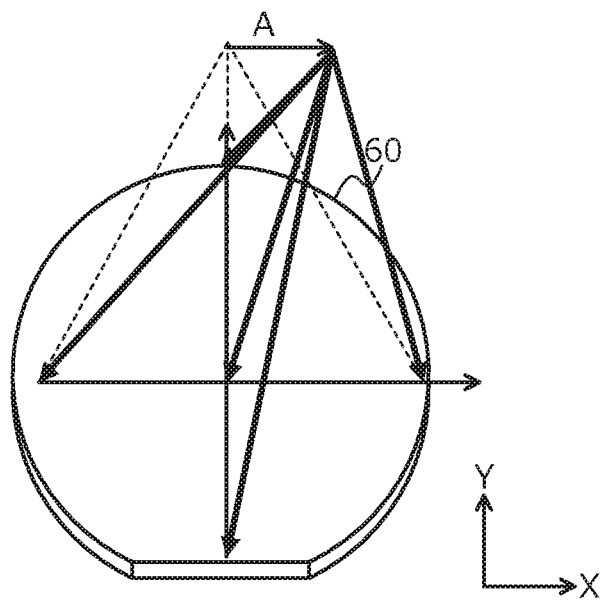
FIG. 11 is a top view depicting ion implantation with an incline in a direction of the off angle in the method of manufacturing a silicon carbide semiconductor device according to the embodiment.
Figure 12:
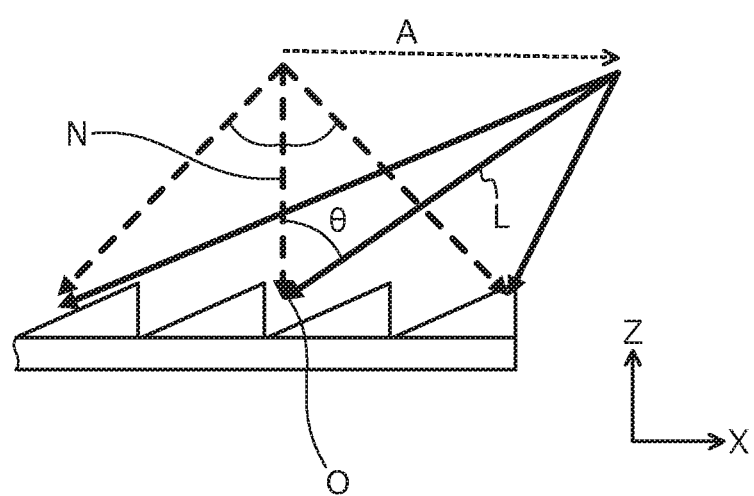
FIG. 12 is a cross-sectional view of the ion implantation of FIG. 11 in the method of manufacturing a silicon carbide semiconductor device according to the embodiment as viewed from the Y-axis direction.

A form of an incline provided in the direction of the off angle will be described. FIG. 11 is a top view depicting ion implantation with an incline in the direction of the off angle in the method of manufacturing a silicon carbide semiconductor device according to the embodiment. FIG. 12 is a cross-sectional view of the ion implantation of FIG. 11 in the method of manufacturing a silicon carbide semiconductor device according to the embodiment as viewed from the Y-axis direction.

In the example depicted in FIGS. 11 and 12, the ion beam L is inclined by moving an ion beam implantation port in the positive direction of the X axis by an amount corresponding to an arrow A. Therefore, the tilt angle θ is provided in the X-axis direction, between the ion beam L that reaches the center O of the silicon carbide semiconductor wafer 60 and the perpendicular N from the center O of the silicon carbide semiconductor wafer 60. As described later, the tilt angle θ may be 3 degrees or more. Due to the off angle of 4 degrees, the tilt angle θ is reduced by the off angle in the case of incline in the same direction as the off angle.

When the lower first $p^+$-type base region 3$b$ and the second $p^+$-type base region 4 are each formed in a shape of a stripe (stripe-shape), the tilt angle θ may be provided in a longitudinal direction of the stripe-shape, between the ion beam L that reaches the center O of the silicon carbide semiconductor wafer 60 and the perpendicular N from the center O of the silicon carbide semiconductor wafer 60. When the longitudinal direction of the stripe-shape is the direction different from the off angle, the tilt angle θ may be 7 degrees or more, and when the longitudinal direction of the stripe-shape is the same as the direction of the off angle, the tilt angle θ may be 3 degrees or more.

When the trench 16 is formed in a stripe-shape, the tilt angle θ may be provided in a longitudinal direction of the stripe-shape of the trench 16, between the ion beam L that reaches the center O of the silicon carbide semiconductor wafer 60 and the perpendicular N from the center O of the silicon carbide semiconductor wafer 60. When the longitudinal direction of the stripe-shape of the trench 16 is the direction different from the off angle, the tilt angle θ may be 7 degrees or more, and when the longitudinal direction of the stripe-shape of the trench 16 is the same as the direction of the off angle, the tilt angle θ may be 3 degrees or more.

When the trench 16 is formed in a polygonal cell shape, the tilt angle θ may be provided in the direction different from the off angle, between the ion beam L that reaches the center O of the silicon carbide semiconductor wafer 60 and the perpendicular N from the center O of the silicon carbide semiconductor wafer 60. Channeling may be prevented by performing the ion implantation in the direction different from the off angle.

Figure 13:
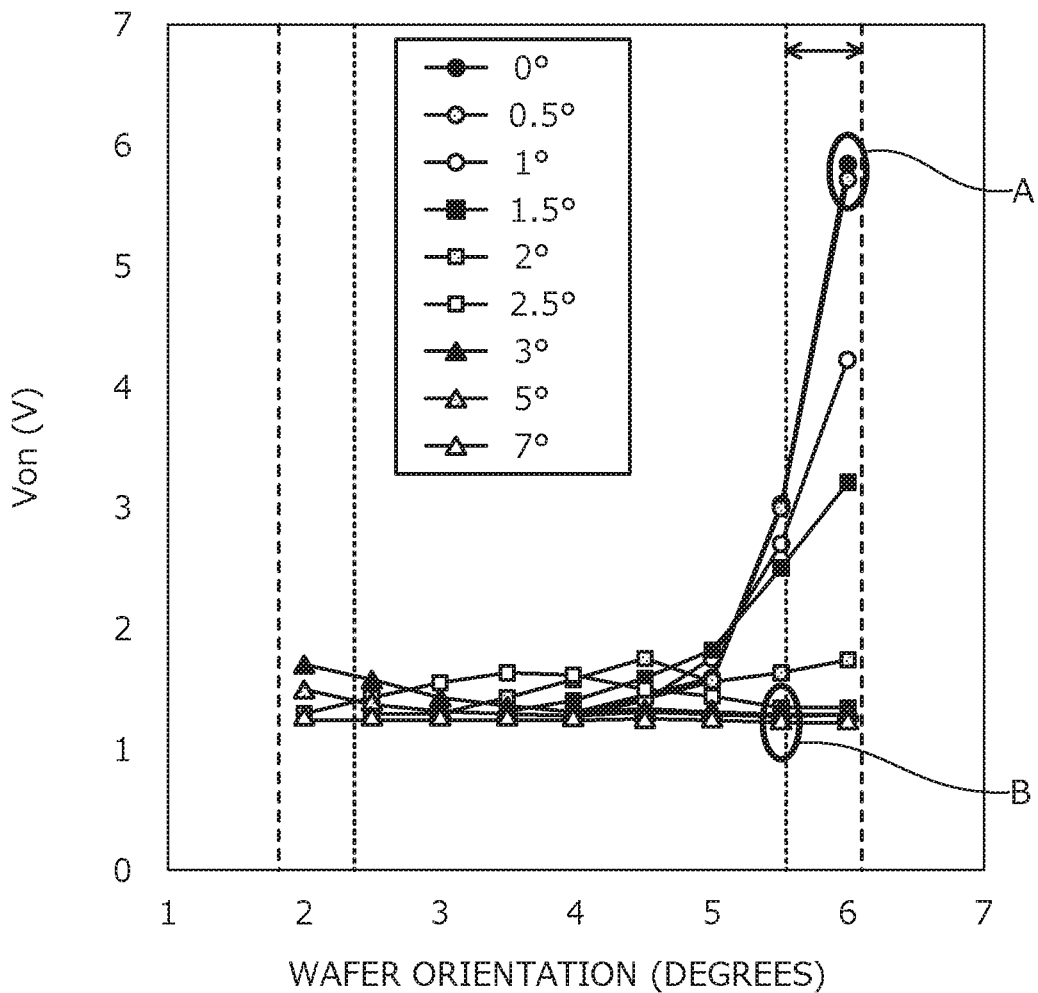
FIG. 13 is a graph depicting Von of a silicon carbide semiconductor device according to the embodiment.

FIG. 13 is a graph depicting Von of the silicon carbide semiconductor device according to the embodiment. In FIG. 13, the horizontal axis indicates an angle (hereinafter referred to as an incline angle) between a crystal plane of a silicon carbide semiconductor wafer and an ion beam having a tilt angle of 0 degrees, in degrees. The vertical axis indicates Von of the silicon carbide semiconductor device in V. FIG. 13 depicts Von of the silicon carbide semiconductor device in which the first $p^+$-type base region 3 and the second $p^+$-type base region 4 are formed by ion implantation with an incline (the tilt angle of 0 to 7 degrees) in the direction of the off angle.

In FIG. 13, since the silicon carbide semiconductor wafer has the off angle of 4 degrees, a 4-degree portion is the center portion. Additionally, due to an incline of ±1.6 degrees occurring in a 6-inch diameter silicon carbide semiconductor wafer and the off-angle standard (±0.5 degrees), the incline angle ranges from a minimum of 1.9 degrees to a maximum of 6.1 degrees.

According to FIG. 13, in the case of the tilt angle in a range of 0 degrees to 1.5 degrees, it can be seen that Von greatly increases when the incline angle approaches 6 degrees. In the case of the tilt angle in a range of 2 degrees to 2.5 degrees, it can be seen that Von increases when the incline angle approaches 6 degrees. On the other hand, in the case of the tilt angle in a range of 3 degrees to 7 degrees, it can be seen that Von does not increase even when the incline angle is close to 6 degrees. Therefore, the increase in Von may be suppressed by setting the tilt angle to 3 degrees or more. When an incline is provided in the direction different from the off angle, the increase in Von may be suppressed by setting the tilt angle to 7 degrees or more due to the absence of the off angle of 4 degrees.

As the tilt angle increases, the angle between the front surface of the silicon carbide semiconductor wafer and the ion beam (hereinafter referred to as an incident angle) increases, and ions do not deeply enter into the semiconductor layer. Therefore, a smaller tilt angle is preferable. Thus, the tilt angle is at least an angle that does not cause channeling and is preferably as small as possible.

FIG. 13 depicts results of the 6-inch diameter silicon carbide semiconductor wafer. In the case of an 8-inch diameter silicon carbide semiconductor wafer, due to an incline of ±2.1 degrees and the off-angle standard (±0.5 degrees), the incline angle ranges from a minimum of 1.4 degrees to a maximum of 6.6 degrees. Therefore, in the case of the 8-inch diameter silicon carbide semiconductor wafer, the tilt angle may be increased by about 0.5 degrees as compared to the case of a silicon carbide semiconductor wafer having the 6-inch diameter silicon carbide semiconductor wafer. For example, when the incline is provided in the off-angle direction, the increase in Von may be suppressed by setting the tilt angle to 3.5 degrees or more. When the incline is provided in a direction different from the off angle, the increase in Von may be suppressed by setting the tilt angle to 7.5 degrees or more due to the absence of the off angle of 4 degrees.

When the off angle of the silicon carbide semiconductor wafer is 2 degrees and the incline is provided in the off-angle direction, the tilt angle may be increased by 2 degrees. For example, in the case of the 6-inch diameter silicon carbide semiconductor wafer, the increase in Von may be suppressed by setting the tilt angle to 5 degrees or more. In the case of the 8-inch diameter silicon carbide semiconductor wafer, the increase in Von may be suppressed by setting the tilt angle to 5.5 degrees or more.

Figure 14:
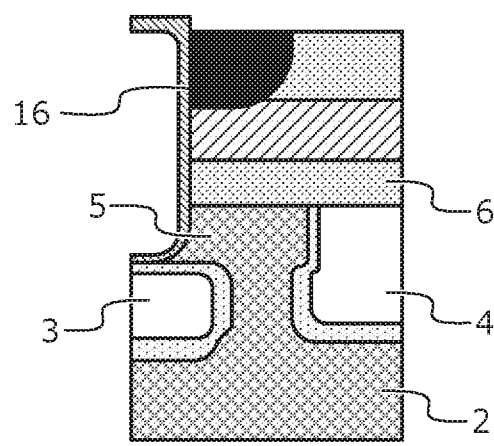
FIG. 14 is a cross-sectional view depicting a silicon carbide semiconductor device according to the embodiment formed on a right side of a silicon carbide semiconductor wafer.

FIG. 14 is a cross-sectional view depicting a silicon carbide semiconductor device according to the embodiment formed on the right side of the silicon carbide semiconductor wafer. A structure of FIG. 14 is a structure of the silicon carbide semiconductor device in a region (B of FIG. 13) in which the first $p^+$-type base region 3 and the second $p^+$-type base region 4 are formed with the tilt angle of 7 degrees and the incline angle is about 5 degrees. On the other hand, a structure depicted in FIG. 32 is a structure of the silicon carbide semiconductor device in a region (A in FIG. 13) in which the first $p^+$-type base region 103 and the second $p^+$-type base region 104 are formed with the tilt angle of 0 degrees and the incline angle is about 6 degrees.

In comparing FIG. 14 and FIG. 32, in FIG. 14, the first $p^+$-type base region 3 and the second $p^+$-type base region 4 do not deeply penetrate into the $n^-$-type silicon carbide epitaxial layer 2. Therefore, the JFET resistance is not increased, and an increase in Von may be suppressed.

Figures 15, 16:
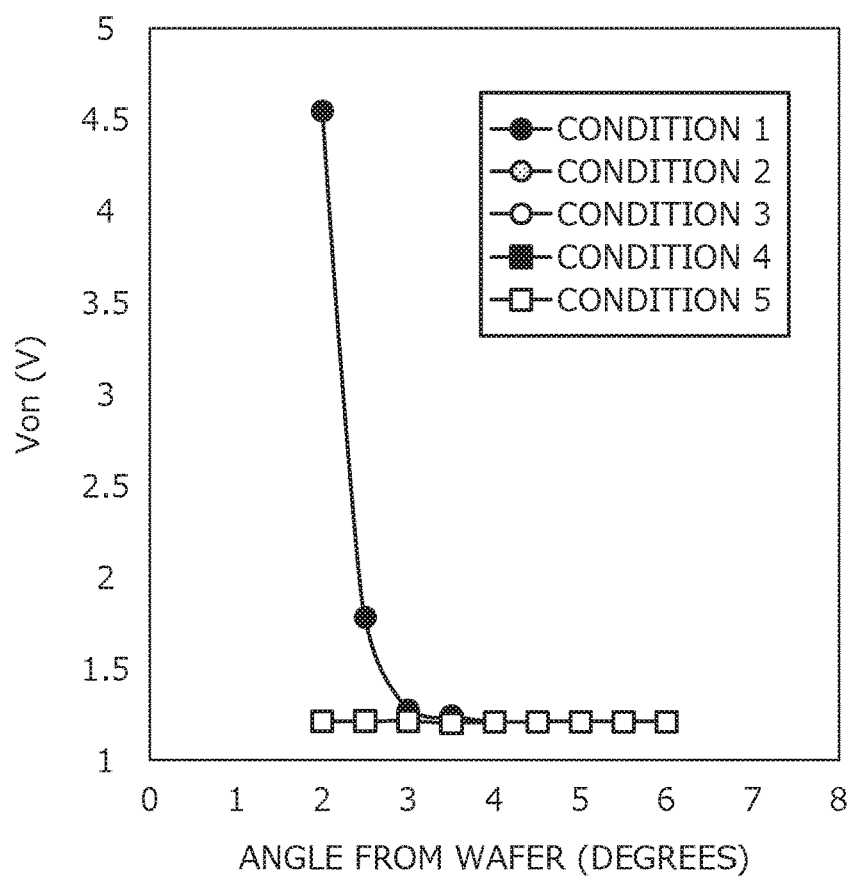
FIG. 15 is a table describing conditions of ion implantation according to the embodiment and conventional methods.
FIG. 16 is a graph depicting Von under the ion implantation conditions in FIG. 15.

In the above description, the ion beam of ion implantation is tilted when the first $p^+$-type base region 3 and the second $p^+$-type base region 4 are formed. An effect of the tilt of the ion beam at the time of formation of other regions will be described. FIG. 15 is a table describing conditions of ion implantation according to the embodiment and conventional methods. In FIG. 15, a $p^+$-type base region indicates the first $p^+$-type base region 3 and the second $p^+$-type base region 4. The same applies to the following description.

Condition 1 in FIG. 15 is an example of a conventional method of manufacturing a silicon carbide semiconductor device in which a tilt is performed in none of the $p^+$-type base region, the $n^{++}$-type source region 107, and the $n^+$-type region 117. Condition 2 in FIG. 15 is an example of an embodiment in which ion implantation is performed with a tilt angle of 7 degrees provided in the Y-axis direction (direction different from the off angle) only in the $p^+$-type base region. Condition 3 in FIG. 15 is an example of an embodiment in which ion implantation is performed with a tilt angle of 3 degrees provided in the positive X-axis direction (direction of the off angle) only in the $p^+$-type base region. Condition 4 in FIG. 15 is an example of a method of manufacturing a silicon carbide semiconductor device in which ion implantation is performed with a tilt angle of 7 degrees provided in the Y-axis direction in all of the $p^+$-type base region, the $n^{++}$-type source region 7, and the $n^+$-type region 17. Condition 5 in FIG. 15 is an example of a method of manufacturing a silicon carbide semiconductor device in which ion implantation is performed with a tilt angle of 3 degrees provided in the positive X-axis direction in all of the $p^+$-type base region, the $n^{++}$-type source region 7, and the $n^+$-type region 17.

Figure 17:
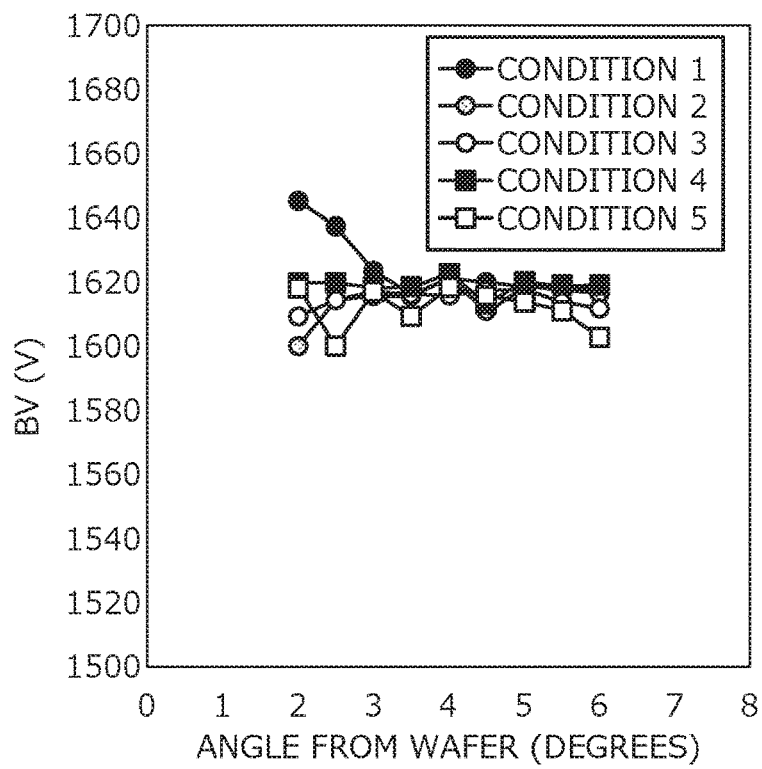
FIG. 17 is a graph depicting breakdown voltage under the ion implantation conditions in FIG. 15.
Figure 18:
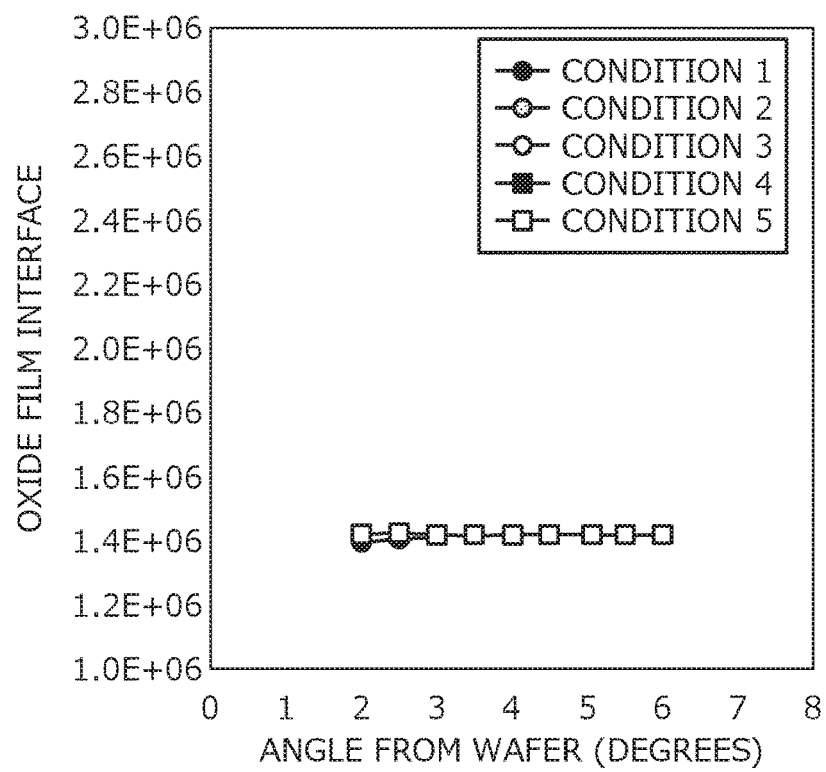
FIG. 18 is a graph depicting an oxide film electric field under the ion implantation conditions in FIG. 15.

Results of Conditions 1 to 5 in FIG. 15 are depicted in FIGS. 16 to 18. FIG. 16 is a graph depicting Von under the ion implantation conditions in FIG. 15. In FIG. 16, the vertical axis indicates Von in V. The horizontal axis indicates the incident angle (angle from the wafer) in degrees. As depicted in FIG. 16, in the case of Condition 1, Von becomes high due to channeling at an incident angle of 2.5 degrees or less; however, in the cases of Conditions 2 to 5, Von remains low. In FIG. 16, data for Conditions 2 to 5 overlap and therefore, in addition to Condition 1, only Condition 5 is depicted.

FIG. 17 is a graph depicting breakdown voltage under the ion implantation conditions in FIG. 15. In FIG. 17, the vertical axis indicates the breakdown voltage (BV) in V. The horizontal axis indicates the incident angle (angle from the wafer) in degrees. As depicted in FIG. 17, in the case of Condition 1, the breakdown voltage becomes high at the incident angle of 3 degrees or less; however, in the cases of Conditions 2 to 5, the breakdown voltage is not significantly changed.

FIG. 18 is a graph depicting an oxide film electric field under the ion implantation conditions in FIG. 15. In FIG. 18, the vertical axis indicates the oxide film electric field in V. The horizontal axis indicates the incident angle (angle from the wafer) in degrees. As depicted in FIG. 18, the oxide film electric field is not significantly changed in any of the cases of Conditions 1 to 5. In FIG. 18, data for Conditions 2 to 5 overlap and therefore, in addition to Condition 1, only Condition 5 is depicted.

From the above, even when the ion implantation is performed without the tilt angle in the $n^{++}$-type source region 7 and the $n^+$-type region 17, Von may be prevented from increasing by performing the ion implantation with the tilt angle provided in the $p^+$-type base region. The tilt in the X-axis direction and the tilt in the Y-axis direction have the same effect of preventing increases in Von.

Figure 19:
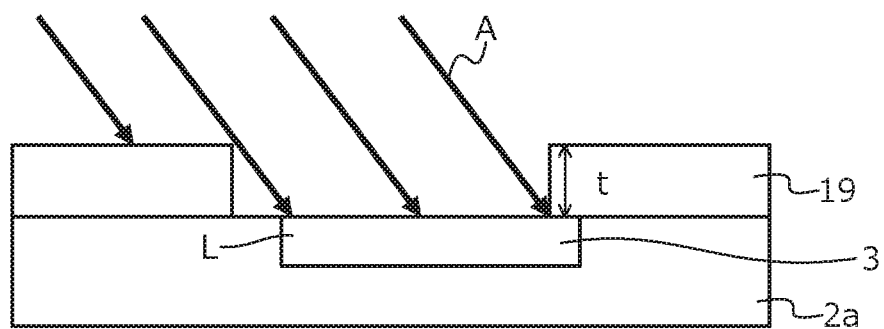
FIG. 19 is a cross-sectional view depicting shadowing in ion implantation in the method of manufacturing a silicon carbide semiconductor device according to the embodiment.

A difference in effect between the tilt in the direction of the off angle and the tilt in the direction different from the off angle will be described. FIG. 19 is a cross-sectional view depicting shadowing in ion implantation in the method of manufacturing a silicon carbide semiconductor device according to the embodiment. Ion implantation is performed in a semiconductor substrate base by using an oxide film mask 19 having a height t=about 1.45 μm and opened in a formation region portion. An ion beam A tilted in the ion implantation forms a shadow of the oxide film mask 19, whereby a region may not be formed in an opened portion of the oxide film mask 19 and a formed region may be shifted (shadowing). In the example depicted in FIG. 19, the first $p^+$-type base region 3 formed on the first $n^-$-type silicon carbide epitaxial layer 2a is shifted by a distance L.

Figure 20:
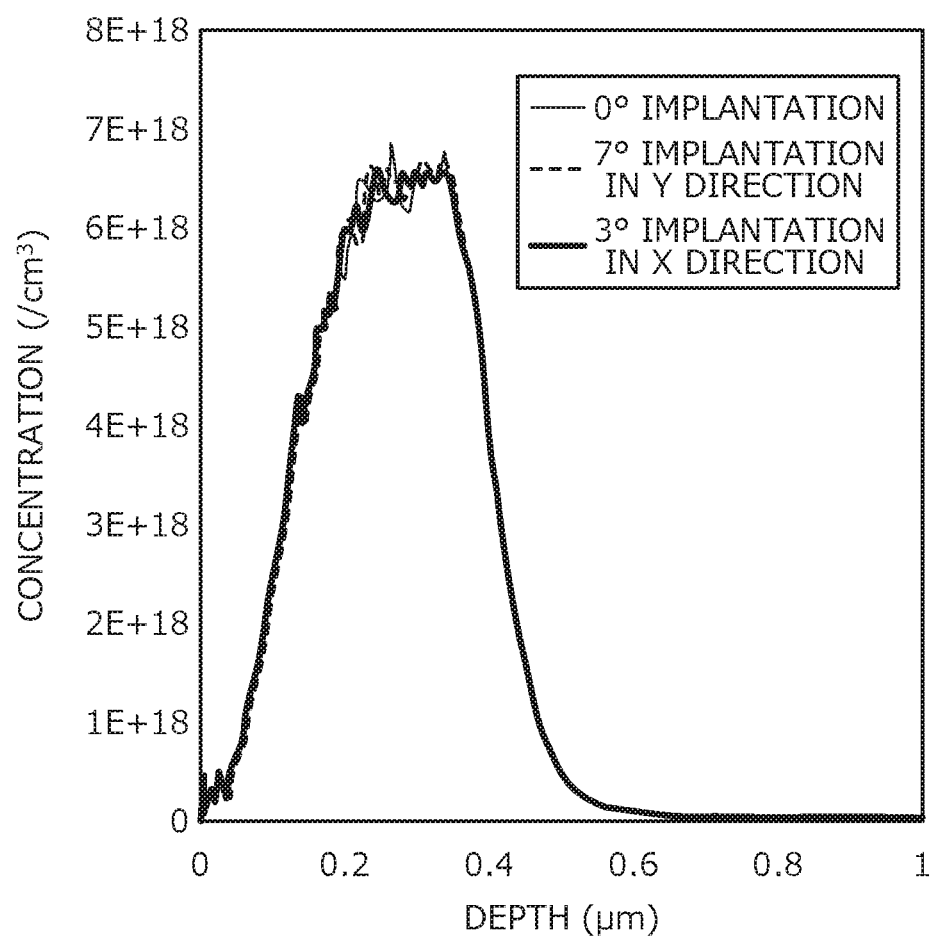
FIG. 20 is a graph depicting an impurity concentration of the first $p^+$-type base region when ion implantation is performed at multiple tilt angles (linear axis).
Figure 21:
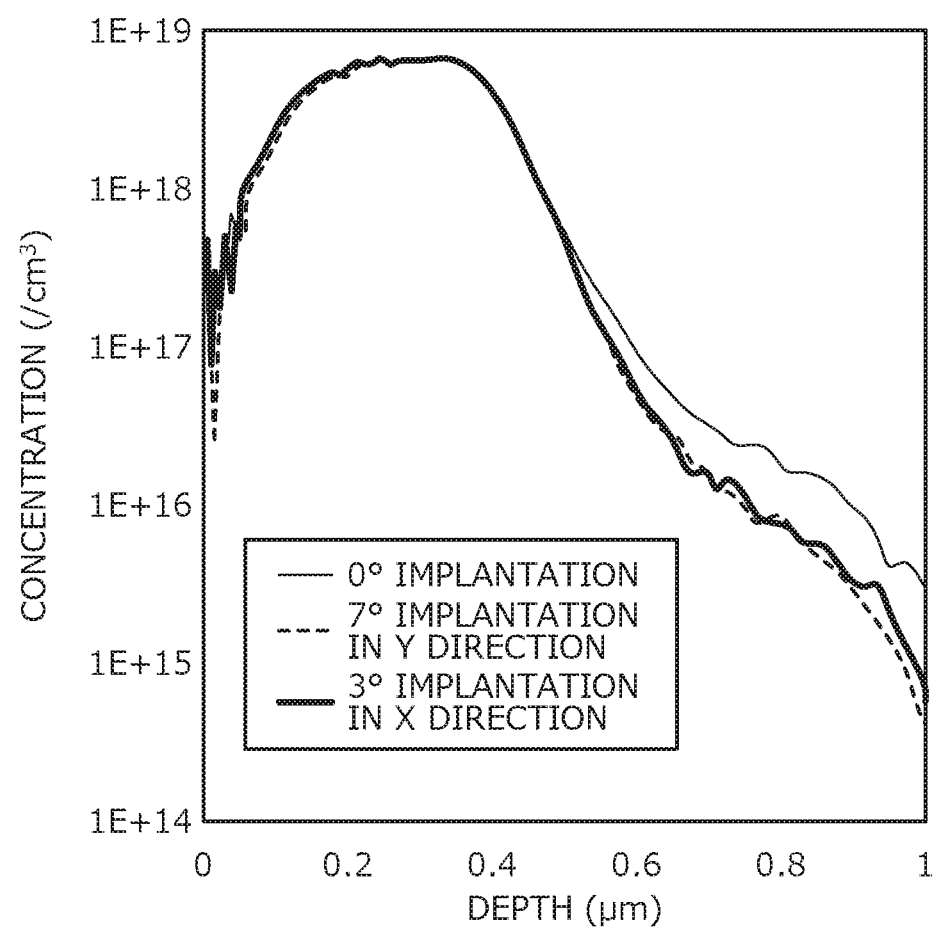
FIG. 21 is a graph depicting the impurity concentration of the first $p^+$-type base region when ion implantation is performed at multiple tilt angles (logarithmic axis).

FIGS. 20 and 21 are graphs depicting the impurity concentration of the first $p^+$-type base region when ion implantation is performed at multiple tilt angles. In FIG. 20, the vertical axis is a linear axis, and in FIG. 21, the vertical axis is a logarithmic axis. In FIGS. 20 and 21, the vertical axis indicates the impurity concentration in $cm^{-3}$. The horizontal axis indicates the depth from the surface of the first $p^+$-type base region 3 in μm. As depicted in FIG. 21, it can be seen that in a region deeper than 0.5 nm from the surface of the first $p^+$-type base region 3, the impurity concentration decreases as the tilt angle in ion implantation increases.

Figure 22:
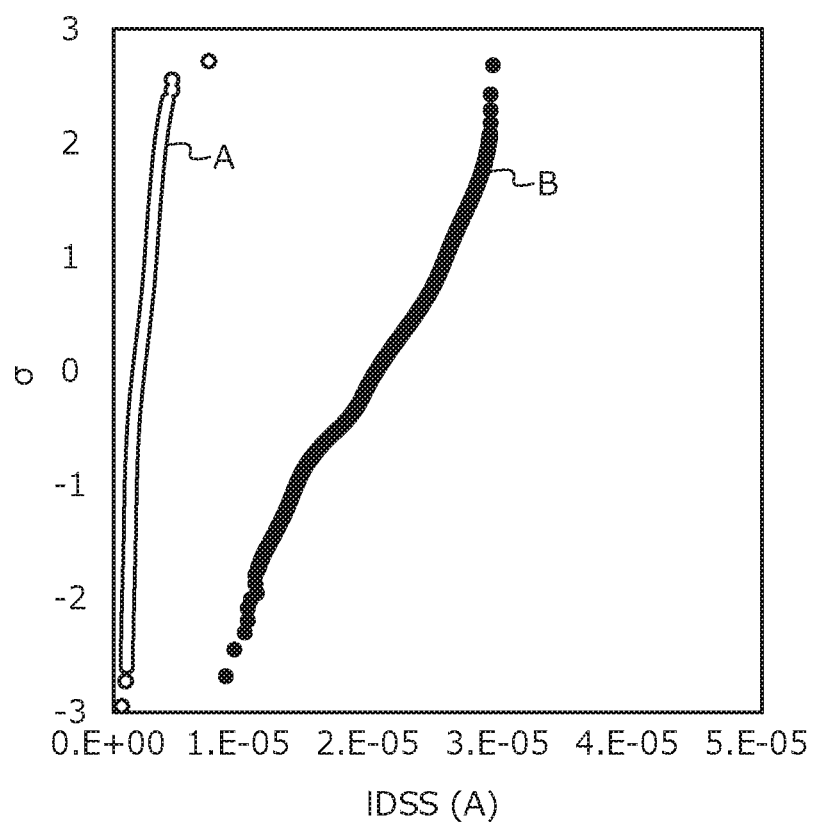
FIG. 22 is a graph depicting leak current between D and S when ion implantation is performed at multiple tilt angles.
Figure 23:
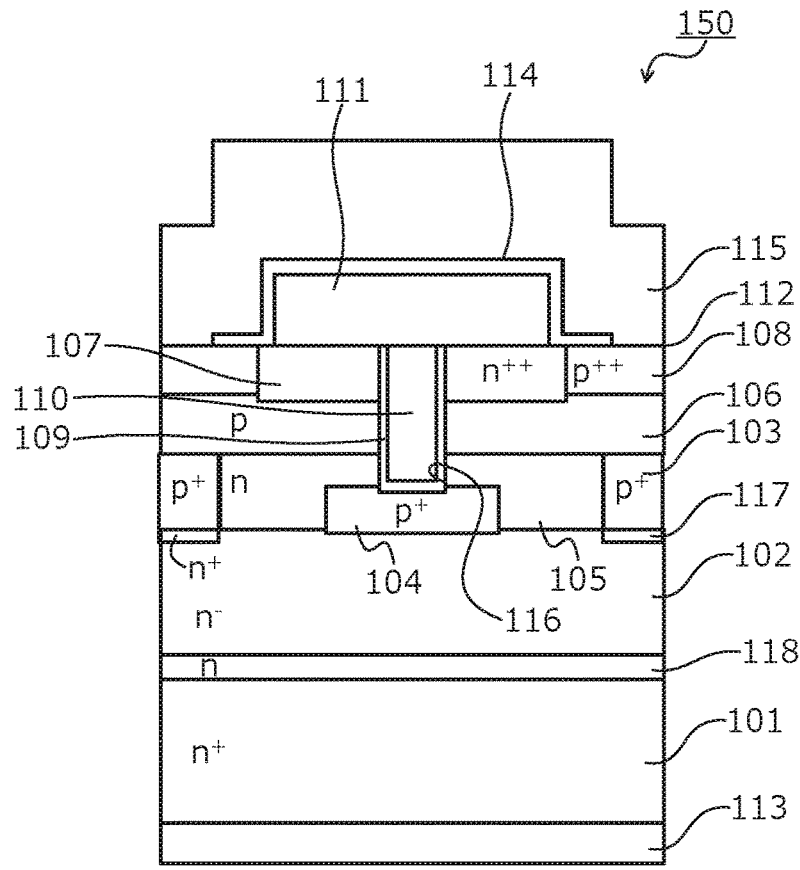
FIG. 23 is a cross-sectional view depicting a structure of a conventional silicon carbide semiconductor device.

FIG. 22 is a graph depicting leak current between D and S when ion implantation is performed at multiple tilt angles. In FIG. 22, the horizontal axis indicates leak current (IDSS) between a drain electrode and a source electrode (between D and S) in units of A, and the vertical axis indicates standard deviation a. FIG. 22 depicts a leak current distribution when a voltage of 1200 V is applied between the drain electrode and the source electrode, curve A depicts a result in the case of a tilt of 3 degrees in the X-axis direction, and curve B depicts a result in the case of a tilt of 7 degrees in the Y-axis direction. As depicted in FIG. 22, in the case of the tilt of 7 degrees in the Y-axis direction, the leak current between D and S increases due to an influence of shadowing.

Because of the influence of shadowing occurring at a large tilt angle, when the sidewall of the trench 16 is formed on an m-plane, the ion implantation may be performed with the tilt of 3 degrees or more in the direction of the off angle rather than performing the ion implantation with the tilt of 7 degrees or more in the direction different from the off angle (since the off angle is 4 degrees in the case of the m-plane, the tilt of 3 degrees or more results in a total of 7 degrees or more). On the other hand, when the sidewall of the trench 16 is formed on an a-plane, the ion implantation may be performed with the tilt of 7 degrees or more in the direction different from the off angle rather than performing the ion implantation with the tilt of 3 degrees or more in the direction of the off angle (since the tilt is in the direction different from the off angle in the case of the a-plane, the tilt is 7 degrees or more).

As described above, according to the method of manufacturing a silicon carbide semiconductor device according to the embodiment, when the first $p^+$-type base region and the second $p^+$-type base region are formed by ion implantation, an ion beam of the ion implantation is inclined (tilted) by 3 degrees or more relative to a perpendicular from the center of the silicon carbide semiconductor wafer. As a result, in the embodiment, since ions are implanted with an incline that is at least a certain amount relative to the front surface of the silicon carbide semiconductor wafer, the influence of channeling may be reduced.

In the above description, the present invention may variously be modified without departing from the spirit of the present invention, and in the embodiments described above, for example, the dimensions and impurity concentrations of the parts are variously set according to required specifications etc. The embodiments described above have been described by taking, as an example, the case of using silicon carbide as a wide bandgap semiconductor; however, the present invention is applicable to a wide bandgap semiconductor material of other than silicon carbide, for example, gallium nitride (GaN). In the embodiments, the first conductivity type is an n-type and the second conductivity type is a p-type; however, the present invention may be implemented similarly even when the first conductivity type is a p-type and the second conductivity type is an n-type.

According to the invention described above, when the first $p^+$-type base region (base region, first base region) and the second $p^+$-type base region (base region, second base region) are formed by ion implantation, the ion beam of the ion implantation is inclined (tilted) by 3 degrees or more relative to a perpendicular from the center of the silicon carbide semiconductor wafer. As a result, since ions are implanted at a certain incline relative to the front surface of the silicon carbide semiconductor wafer in the embodiment, the influence of channeling may be reduced.

The method of manufacturing a silicon carbide semiconductor device of the present invention achieves an effect of preventing the ON voltage from increasing by reducing the influence of channeling.

As described above, the method of manufacturing a silicon carbide semiconductor device according to the present invention is useful for silicon carbide semiconductor devices used in an inverter circuit in which a diode is connected antiparallel to the silicon carbide semiconductor device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method, comprising:
forming on a front surface of a silicon carbide semiconductor substrate of a first conductivity type, a first semiconductor layer of the first conductivity type having an impurity concentration lower than an impurity concentration of the silicon carbide semiconductor substrate;
selectively forming a plurality of high-concentration regions of the first conductivity type and a plurality of base regions of a second conductivity type in the first semiconductor layer;
forming a second semiconductor layer of the second conductivity type on a surface of a first side of the first semiconductor layer opposite to a second side of the first semiconductor layer facing the silicon carbide semiconductor substrate;
selectively forming a first semiconductor region of the first conductivity type in a surface layer of the second semiconductor layer;
forming a plurality of trenches penetrating through the first semiconductor region and the second semiconductor layer, and reaching the first semiconductor layer;
forming a plurality of gate electrodes, each of which is formed in a corresponding one of the trenches via a gate insulating film;
forming an interlayer insulating film on the gate electrodes;
forming a first electrode in contact with the second semiconductor layer and the first semiconductor region; and
forming a second electrode on a rear surface of the silicon carbide semiconductor substrate opposite to the front surface, wherein
forming the high-concentration regions and the base regions includes implanting an impurity of the second conductivity type from an angle that relative to a perpendicular to the front surface of the silicon carbide semiconductor substrate, is in a range of three degrees to seven degrees, to form the base regions, each of which is provided beneath a respective one of the trenches or between a respective adjacent two of the trenches such that each of the base regions between the respective adjacent two of the trenches is in contact with a respective one of the high-concentration regions.

2. The method according to claim 1, wherein forming the base region includes forming the base region by implanting the impurity of the second conductivity type from the angle that relative to the perpendicular to the front surface of the silicon carbide semiconductor substrate, is in a range of three degrees to seven degrees in a direction of an off angle of the silicon carbide semiconductor substrate.

3. The method according to claim 2, wherein the off angle of the silicon carbide semiconductor substrate is four degrees ±0.5 degrees.

4. The method according to claim 1, wherein forming the base region includes forming the base region by implanting the impurity of the second conductivity type from the angle that relative to the perpendicular to the front surface of the silicon carbide semiconductor substrate, is in a range of seven degrees to eleven degrees in a direction different from a direction of an off angle of the silicon carbide semiconductor substrate.

5. The method according to claim 1, wherein forming the base region includes forming the base region in a stripe-shape by implanting the impurity of the second conductivity type from the angle that relative to the perpendicular to the front surface of the silicon carbide semiconductor substrate, is in a range of three degrees to seven degrees in a longitudinal direction of the base region.

6. The method according to claim 1, wherein
forming the plurality of trenches includes forming each of the plurality of trenches to extend in a longitudinal direction thereof, to form a shape of a stripe, and
forming the base region includes forming the base region by implanting the impurity of the second conductivity type from the angle that relative to the perpendicular to the front surface of the silicon carbide semiconductor substrate, is in a range of three degrees to seven degrees in the longitudinal direction of the plurality of trenches.

7. The method according to claim 1, wherein
the second semiconductor layer includes an a-plane and an m-plane,
forming the plurality of trenches includes forming each of the plurality of trenches to have a sidewall on the m-plane of the second semiconductor layer, and
forming the base region includes forming the base region by implanting the impurity of the second conductivity type from the angle that relative to the perpendicular to the front surface of the silicon carbide semiconductor substrate, is in a range of three degrees to seven degrees in a direction of an off angle of the silicon carbide semiconductor substrate.

8. The method according to claim 1, wherein
the second semiconductor layer includes an a-plane and an m-plane,
forming the plurality of trenches includes forming each of the plurality of trenches to have a sidewall on the a-plane of the second semiconductor layer, and
forming the base region includes forming the base region by implanting the impurity of the second conductivity type from the angle that relative to the perpendicular to the front surface of the silicon carbide semiconductor substrate, is in a range of seven degrees to eleven degrees in a direction different from an off angle of the silicon carbide semiconductor substrate.

9. The method according to claim 1, wherein
forming the plurality of trenches includes forming the plurality of trenches to have a polygonal cell shape, and
forming the base region includes forming the base region by implanting the impurity of the second conductivity type from the angle that relative to the perpendicular to the front surface of the silicon carbide semiconductor substrate, is in a range of seven degrees to eleven degrees in a direction different from an off angle of the silicon carbide semiconductor substrate.

10. The method according to claim 1, wherein the base region is formed by a first base region formed between two adjacent trenches of the plurality of trenches, and a second base region formed at a bottom of a corresponding one of the plurality of trenches.

11. The method according to claim 1, further comprising
selectively forming a second semiconductor region of the second conductivity type in contact with the first semiconductor region in the surface layer of the second semiconductor layer by implanting an impurity of the second conductivity type from an angle that relative to the perpendicular to the front surface of the silicon carbide semiconductor substrate, is in a range of three degrees to seven degrees, wherein forming the second semiconductor layer includes implanting an impurity of the second conductivity type into the second semiconductor layer from an angle that relative to the perpendicular to the front surface of the silicon carbide semiconductor substrate, is in a range of three degrees to seven degrees, and forming the first semiconductor region includes forming the first semiconductor region by implanting an impurity of the first conductivity type from an angle that relative to the perpendicular to the front surface of the silicon carbide semiconductor substrate, is in a range of three degrees to seven degrees.

12. The method according to claim 1, wherein an oxide film mask is used in implanting an impurity of the first conductivity type and an impurity of the second conductivity type.

13. The method according to claim 1, wherein the impurity of the second conductivity type is aluminum.

\* \* \* \* \*